United States Patent
Chikahisa et al.

(10) Patent No.: US 6,562,406 B1
(45) Date of Patent: May 13, 2003

(54) APPARATUS AND METHOD FOR APPLYING VISCOUS FLUID

(75) Inventors: Naoichi Chikahisa, Kofu (JP); Hiroyuki Miyake, Takatsuki (JP); Takashi Sasaki, Kofu (JP); Akira Iizuka, Yamanashi (JP); Eiichiro Terayama, Kofu (JP); Yuzuru Inaba, Kofu (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/647,237
(22) PCT Filed: Mar. 30, 1999
(86) PCT No.: PCT/JP99/01611
§ 371 (c)(1), (2), (4) Date: Sep. 28, 2000
(87) PCT Pub. No.: WO99/49987
PCT Pub. Date: Oct. 7, 1999

(30) Foreign Application Priority Data

Mar. 31, 1998 (JP) ............................................. 10-087319

(51) Int. Cl.$^7$ ............................. B05D 5/00; B05C 11/00
(52) U.S. Cl. ...................... 427/256; 118/410; 118/663; 118/684; 118/688; 118/712
(58) Field of Search ...................... 427/96, 256, 284, 427/286, 287; 118/663, 684, 688, 712, 410; 156/578

(56) References Cited

U.S. PATENT DOCUMENTS

| | | | |
|---|---|---|---|
| 4,387,834 A | * 6/1983 | Bishop | ........................ 198/615 |
| 4,801,051 A | * 1/1989 | Lewis et al. | ................. 222/309 |
| 5,265,773 A | * 11/1993 | Harada | ......................... 222/241 |
| 5,564,606 A | 10/1996 | Engel | |
| 5,971,227 A | * 10/1999 | White et al. | .................. 222/333 |
| 5,992,688 A | * 11/1999 | Lewis et al. | ..................... 222/1 |
| 6,234,358 B1 | * 5/2001 | Romine et al. | ........... 222/181.3 |

FOREIGN PATENT DOCUMENTS

| | | |
|---|---|---|
| FR | 2 656 048 | 6/1991 |
| GB | 2 037 372 | 7/1980 |
| JP | 2-280962 | 11/1990 |
| JP | 3-280590 | 11/1991 |
| JP | 6-226147 | 8/1994 |
| JP | 7-75870 | 3/1995 |

\* cited by examiner

Primary Examiner—Brian K. Talbot
(74) Attorney, Agent, or Firm—Wenderoth, Lind & Ponack, L.L.P.

(57) ABSTRACT

The object of the present invention is to provide an apparatus and a method for applying a viscous fluid whereby a constant application diameter is achieved through a simple operation without a Tact loss while a surface of a member to be applied can be less damaged. An adhesive application member (2111) having a screw portion (2122) inserted therein is rotated by a rotating device (230), so that a nozzle stopper (2114) of the adhesive application member is prevented from interfering with a wiring pattern on a face of a circuit board. Moreover, the screw portion is rotated synchronously as well when the adhesive application member is rotated, thereby preventing the adhesive from being discharged out from the nozzle in consequence to the rotation of the adhesive application member. An application diameter can hence be uniformed. The rotation of the screw portion is controlled in accordance with a viscosity of the adhesive, thus achieving the application in a required application diameter through a simple operation.

22 Claims, 23 Drawing Sheets

| VISCOUS FLUID | APPLICATION DIAMETER | ROTATION TIME OF DISCHARGE SHAFT |
|---|---|---|
| A | φ0.7<br>φ0.75<br>φ0.8<br>⋮ | 10ms<br>15ms<br>20ms<br>⋮ |
| B | φ0.7<br>⋮ | 8ms<br>⋮ |
| C | φ0.7<br>⋮ | 12ms<br>⋮ |

APPARATUS AND METHOD FOR APPLYING VISCOUS FLUID

TECHNICAL FIELD

The present invention relates to an apparatus and a method for applying a viscous fluid, e.g., used in applying an adhesive onto a circuit board to bond electronic components to the circuit board.

BACKGROUND ART

Such an adhesive applying apparatus 30 as shown in FIG. 26 has conventionally been employed to apply an adhesive onto a circuit board to bond electronic components to the circuit board. The adhesive applying apparatus 30 includes an adhesive application head unit 15 which will be described later, a Y-table 20 loading the circuit board thereon to which the adhesive is to be applied and moving the circuit board in a Y-direction, an X-robot unit 21 moving the adhesive application head unit 15 in an X-direction orthogonal to the Y-direction, and a controller 22 controlling operations of at least the adhesive application head unit 15, Y-table 20 and X-robot unit 21.

As indicated in FIGS. 27 and 28, the adhesive application head unit 15 has three sets of application mechanism portions for extruding and applying the adhesive with compressed air. Each application mechanism portion comprises a syringe 2 in which the adhesive 13 is stored and from which a predetermined amount of the adhesive 13 is discharged from a nozzle 1 through the injection of compressed air, a compressed air feed system 9 for feeding the compressed air to the syringe 2, and a lift mechanism 3 for moving the syringe 2 up and down in a thicknesswise direction of the circuit board so as to apply the adhesive 13 discharged to a leading end of the nozzle 1 onto the circuit board. The compressed air feed system 9 is provided with a piping 10 connected to the syringe 2 for feeding the compressed air into the syringe 2, and a valve 11 for controlling the supply of the compressed air to the syringe 2. The lift mechanism 3 is provided with a lift shaft 4 coupled to the syringe 2 and allowing the compressed air to pass through the lift shaft 4, a lever 5 rotating about a supporting shaft 14 and having one end 5a coupled to the lift shaft 4 and the other end brought into contact with a driving shaft of a nozzle selection cylinder 7, a cam follower 6 set to the lever 5 in a state to be rotatable, and a cam 8 engaged with the cam follower 6. In the lift mechanism 3, when the cam 8 rotates, at the lever 5 where the cam follower 6 and cam 8 are brought into contact with each other by the nozzle selection cylinder 7, the one end 5a of the lever 5 rotates about the supporting shaft 14, thereby moving the lift shaft 4 in the above thicknesswise direction.

The conventional adhesive applying apparatus 30 constituted as above operates in the following manner.

Before the adhesive 13 is started to be applied to the circuit board, the application head unit 15 carries out a test application of the adhesive 13 on a test tape 16 as shown in FIG. 27. More specifically, the valve 11 of the compressed air feed system 9 operates for a predetermined time, thereby pressing a float 12 in the syringe 2 down by the supplied compressed air, and consequently the adhesive 13 stored in the syringe 2 is discharged by a predetermined amount from a leading end 1a of the nozzle 1. The nozzle selection cylinder 7 then acts thereby bringing the cam follower 6 and cam 8 of the lever 5 into contact with each other. As a result of the rotation of the cam 8, the one end 5a of the lever 5 rotates as described above, lowering the syringe 2 in the thicknesswise direction via the lift shaft 4. The adhesive 13 discharged to the leading end 1a of the nozzle 1 is hence applied onto the test tape 16. After the test application, the cam 8 rotates and the syringe 2 moves up to an original position.

An application state of the adhesive 13 at the test application is picked up by a recognition camera 19. The controller 22 measures an area of the test application on the basis of image information output from the recognition camera 19, thereby judging whether or not a preliminarily set target-application-diameter is satisfied. The above test application and image pick-up operation are conducted until a diameter of the test application is kept within an allowance of the target-application-diameter. The adhesive 13 is started to be applied to the circuit board after the diameter of the test application is within the allowance of the target-application-diameter.

In the conventional adhesive applying apparatus 30 as above, as the amount of the compressed air supplied to the syringe 2 increases, the adhesive 13 in the syringe 2 decreases. The application diameter becomes smaller in accordance with a decrease of the adhesive 13 in the syringe 2 if the adhesive 13 is extruded with the same amount of air and the same pressure of the air at all times. so, in order to obtain a constant application diameter irrespective of the amount of the adhesive 13 remaining in the syringe 2, it is not enough to simply control the pressure of the compressed air and the amount of the air supplied to the syringe 2. The pressure of the compressed air and the amount of the air are required to be controlled also in accordance with a temperature of the adhesive 13 and a state of the test tape 16. Furthermore, these four conditions, namely, the pressure of the compressed air, the amount of the air, the temperature of the adhesive and the state of the tape should be selected for each kind of the adhesive and for each nozzle to be used in the conventional apparatus 30. Therefore, not everyone can handle the conventional adhesive applying apparatus 30. The conventional apparatus consumes much time in discharging the adhesive, and exhibits a loss of a cycle time in correcting the application diameter.

An apparatus disclosed in U.S. Pat. No. 5,564,606 proposes a solution to the above problem. According to the disclosed apparatus as shown in FIG. 29, a screw 33 is fitted to a sleeve 34 in a state where the screw can be rotated about an axis thereof by a motor 32 and, a nozzle 31 is disposed coaxially with the screw 33. A viscous material is supplied to the sleeve 34 through a path 35, sent to the nozzle 31 as a result of the rotation of the screw 33 about the axis, and discharged from a leading end of the nozzle 31. A constituting portion including the nozzle 31 is moved in an axial direction of the nozzle 31, whereby the viscous material discharged from the leading end of the nozzle 31 is applied to a member.

Since the above apparatus is adapted to discharge the viscous material through the rotation of the screw 33, the aforementioned problem caused by the amount of the remaining viscous material is eliminated.

As indicated by a chain double-dashed line, FIG. 29 also proposes another type of the apparatus, wherein a nozzle stopper 36 is erected at a portion of the sleeve 34 to form a predetermined gap between the leading end of the nozzle 31 and a face of the circuit board, for instance, when the viscous material is applied to the circuit board. The nozzle stopper is set adjacent to the nozzle 31, having a slightly larger length than a total length of the nozzle 31, with a leading end of the nozzle stopper 36 maintained in contact with the face of the circuit board.

However, an arrangement position of the nozzle stopper 36 relative to the nozzle 31 cannot be changed in the above prior art of the screw type equipped with the nozzle stopper 36. when the nozzle 31 moves in the axial direction to apply the viscous material, the leading end of the nozzle stopper 36 comes into contact with a wiring pattern, etc. formed on the face of the circuit board, and possibly damages the wiring pattern, etc.

The present invention is devised to solve the above-described problems, and has for its object to provide an apparatus and a method for applying a viscous fluid, which enables anyone to handle the apparatus with ease while obtaining a constant application diameter without a cycle time loss and with less possibility of damaging a surface of a member to which the fluid is to be applied.

SUMMARY OF INVENTION

According to a first aspect of the present invention, there is provided an apparatus for applying a viscous fluid which comprises:

a viscous fluid application member which receives a viscous fluid and has a nozzle for discharging the viscous fluid from one end thereof;

a discharge shaft for sending the viscous fluid in an axial direction of the nozzle when the discharge shaft is rotated by a discharge shaft-rotating device in a direction about an axis of the nozzle, while the discharge shaft is inserted within the viscous fluid application member and is parallel to the axial direction, wherein the viscous fluid application member is rotatable in the direction about the axis of the nozzle, to thereby discharge the viscous fluid from the one end of the nozzle so that the viscous fluid is held at the one end of the nozzle;

a nozzle-moving device for moving the viscous fluid application member in the axial direction of the nozzle, to thereby apply the viscous fluid held at the one end of the nozzle to an object; and a viscous fluid application member-rotating device for rotating the viscous fluid application member in a direction about a central axis of the discharge shaft in accordance with an application condition for the viscous fluid to the object.

A Viscous fluid-applying apparatus according to a second aspect of the present invention may be provided with a discharge prevention device for preventing the viscous fluid from being discharged from the one end of the nozzle when the viscous fluid application member is rotated by the viscous fluid application member-rotating device.

In a viscous fluid-applying apparatus according to a third aspect of the present invention, the discharge prevention device is a control device controlling an operation of the discharge shaft-rotating device, thereby rotating the discharge shaft about the axis thereof in a rotation direction and by a rotation amount so that the viscous fluid is prevented from being discharged from the one end of the nozzle when the viscous fluid application member is rotated by the viscous fluid application member-rotating device.

The control device controls the operation of the discharge shaft-rotating device, thereby rotating the discharge shaft about the axis thereof in a rotational direction and by a rotational amount so that the discharge shaft does not rotate about the axis thereof relative to the rotation of the viscous fluid application member.

In a method for applying a viscous fluid according to a fourth aspect of the present invention, there is provided a method for applying a viscous fluid which comprises:

rotating a discharge shaft in a direction about an axis thereof in a manner such that a viscous fluid is prevented from being discharged from one end of a nozzle when a viscous fluid application member, into which the discharge shaft is inserted and parallel to an axial direction of the nozzle, and in a manner to be rotatable in a direction about an axis of the discharge shaft in accordance with an application condition for the viscous fluid to an object, thereby discharging the viscous fluid from the one end of the nozzle so that the viscous fluid is held at the one end of the nozzle; and applying the viscous fluid discharged and held at the one end of the nozzle to the object when the one end of the nozzle comes into contact with the object.

As is fully described above, according to the viscous fluid applying apparatus in the first aspect of the present invention, the apparatus is constituted to discharge the viscous fluid from one end of the nozzle through the rotation of the discharge shaft in a direction about the axis thereof, and is provided with the viscous fluid application member-rotating device. Accordingly, the viscous fluid application member can be rotated in the direction about the axis of the discharge shaft to cope with application conditions, e.g., an increase of a number of application points of the viscous fluid, an interference preventive arrangement for a member to which the viscous fluid is to be applied, and the like. Thus, a possibility of damaging a surface of the member which the viscous fluid is to be applied is decreased.

According to the viscous fluid applying apparatus of the second aspect and the viscous fluid application and method of the fourth aspect of the present invention, the discharge prevention device is provided so that the viscous fluid is prevented from being discharged from the nozzle when the viscous fluid application member is rotated in the direction about the axis of the discharge shaft. Therefore, an excessive amount of viscous fluid affecting the application amount is never accumulated at one end of the nozzle, thereby improving accuracy of the application diameter. In particular, when the viscous fluid is to be applied in the same application size for a plurality of times, since the excess accumulation of the viscous fluid is eliminated, the amount of the viscous fluid discharged from the one end of the nozzle through the rotation of the discharge shaft in the direction about the axis thereof can be kept uniform at all times. In other words, a constant application size is obtained at all times.

According to the viscous fluid applying apparatus of the third aspect of the present invention, since the control device is provided which controls the rotation of the discharge shaft in the direction about the axis thereof, correspondingly to physical properties of the viscous fluid, the application operation for the viscous fluid of the required application size can be carried out automatically, allowing any worker to handle the apparatus easily.

BRIEF DESCRIPTION OF THE DRAWINGS

These and other aspects and features of the present invention will become clear from the following description taken in conjunction with the preferred embodiments thereof with reference to the accompanying drawings, in which:

FIG. 15 is a table showing a relationship of viscous fluids, application diameters and rotation times of the discharge shaft, which are stored in the control device of the adhesive applying apparatus of FIG. 12;

DETAILED DESCRIPTION OF THE PREFERRED EMBODIMENTS

Figure 1:
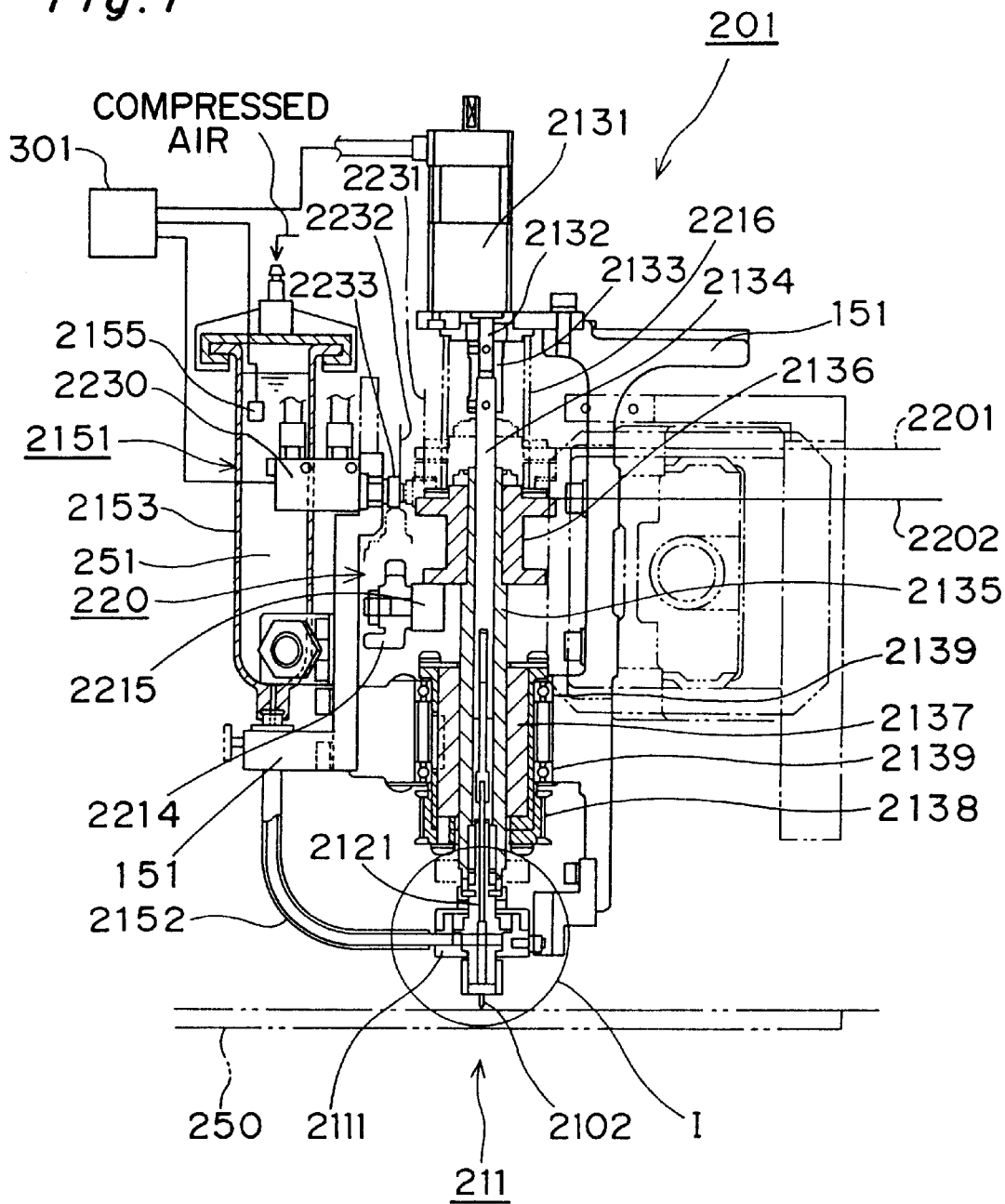
FIG. 1 is a partially sectional, right side view of an adhesive application head unit of an adhesive applying apparatus in an embodiment of the present invention.

An apparatus and a method for applying a viscous fluid according to preferred embodiments of the present invention will be described with reference to the drawings. The above method is executed by the above apparatus. Like parts are designated by like reference numerals throughout the drawings.

According to the present embodiments, an adhesive exemplifies the "viscous fluid" described in the foregoing "SUMMARY OF INVENTION". similarly, a circuit board is an example functioning as the "member to be applied" and an adhesive application member is an example functioning as the "viscous material application member". However, the "viscous fluid" is not limited to the adhesive. That is, a viscous fluid, for instance a sealant for sealing electronic components, a solder paste or the like, such that the fluid does not flow out by its own weight from an applying nozzle corresponds to the "viscous fluid". Likewise, the "member to be applied" is not limited to the circuit board. In the present embodiments in which the circuit board is an example of the "member to be applied", the "application condition for the viscous fluid" in the "SUMMARY OF INVENTION" is, e.g., an orientation of the circuit board; that is, whether the circuit board is arranged to extend in a longitudinal direction or in a lateral direction, a position of a wiring pattern on the circuit board relative to a nozzle stopper, etc.

Figure 12:
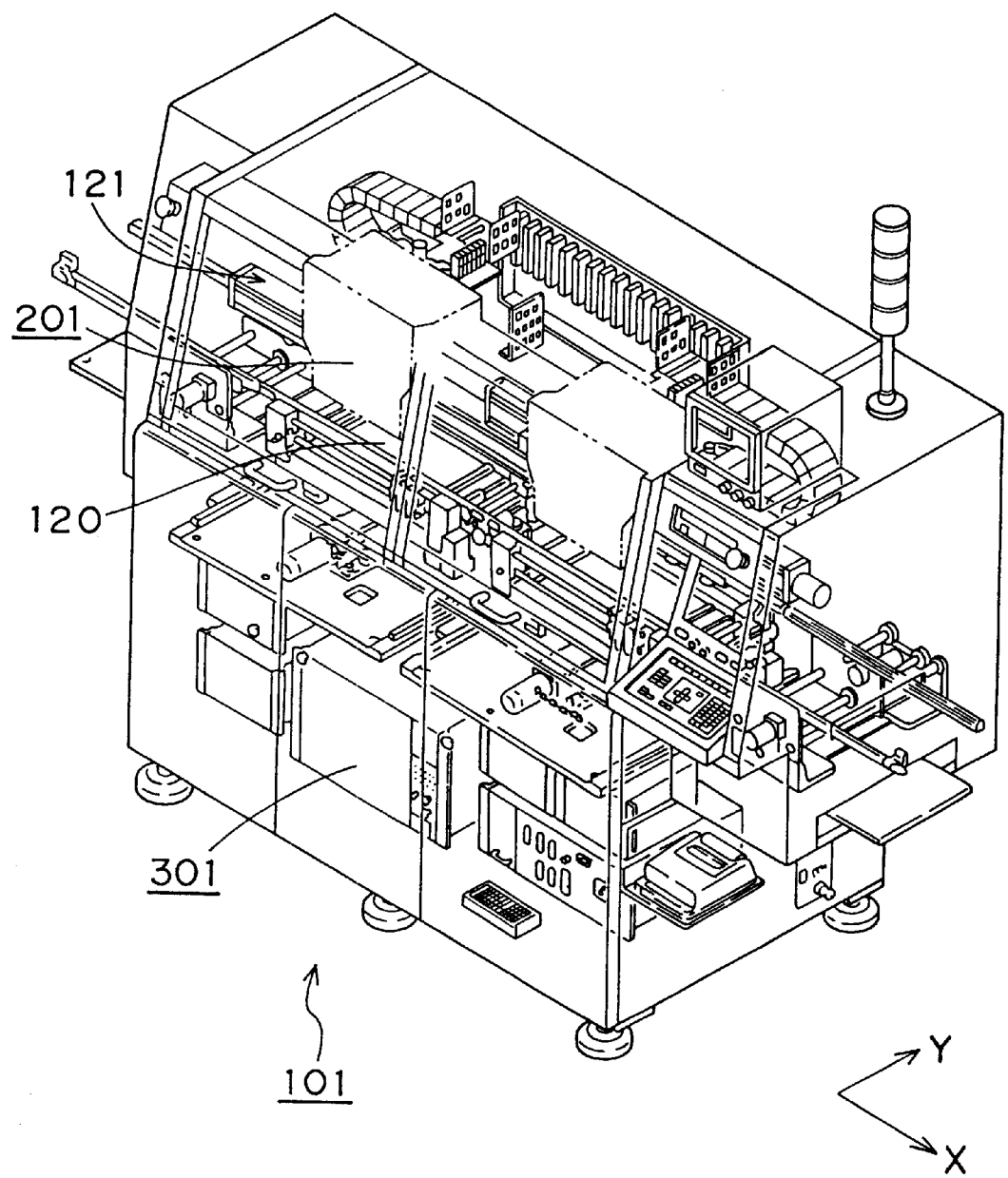
FIG. 12 is a perspective view of the adhesive applying apparatus in the embodiment of the present invention.

Since the adhesive is used as the viscous fluid in the embodiments, the viscous fluid-applying apparatus corresponds to an adhesive-applying apparatus. As shown in FIG. 12, an adhesive-applying apparatus 101 according to the embodiment comprises roughly an adhesive application head unit 201, a Y-table 120 loading a circuit board to which an adhesive is to be applied and moving the circuit board in a Y-direction, an X-robot unit 121 moving the adhesive application head unit 201 in an X-direction orthogonal to the Y-direction in a plane, and a control device 301 controlling operations of at least the adhesive application head unit 201, Y-table 120 and X-robot unit 121. The apparatus is constituted in the same manner as the conventional adhesive applying apparatus 30 except for the adhesive application head unit 201 and control device 301. Thus, the Y-table 120 corresponds to the conventional Y-table 20 and the X-robot unit 121 corresponds to the conventional X-robot unit 21, and accordingly,the description of the Y-table 120 and X-robot unit 121 will be omitted here. The adhesive application head unit 201 and control device 301 will now be described hereinafter. Although the adhesive application head unit 201 is illustrated in a block and not specifically shown in structure in FIG. 12, a concrete structure of the adhesive application head unit 201 is indicated in FIGS. 1 and 3-5. For making the illustration clear, a hatching representing a section is omitted from FIG. 1 for the neighborhood of an adhesive application member 2111 to be described later.

Figure 3:
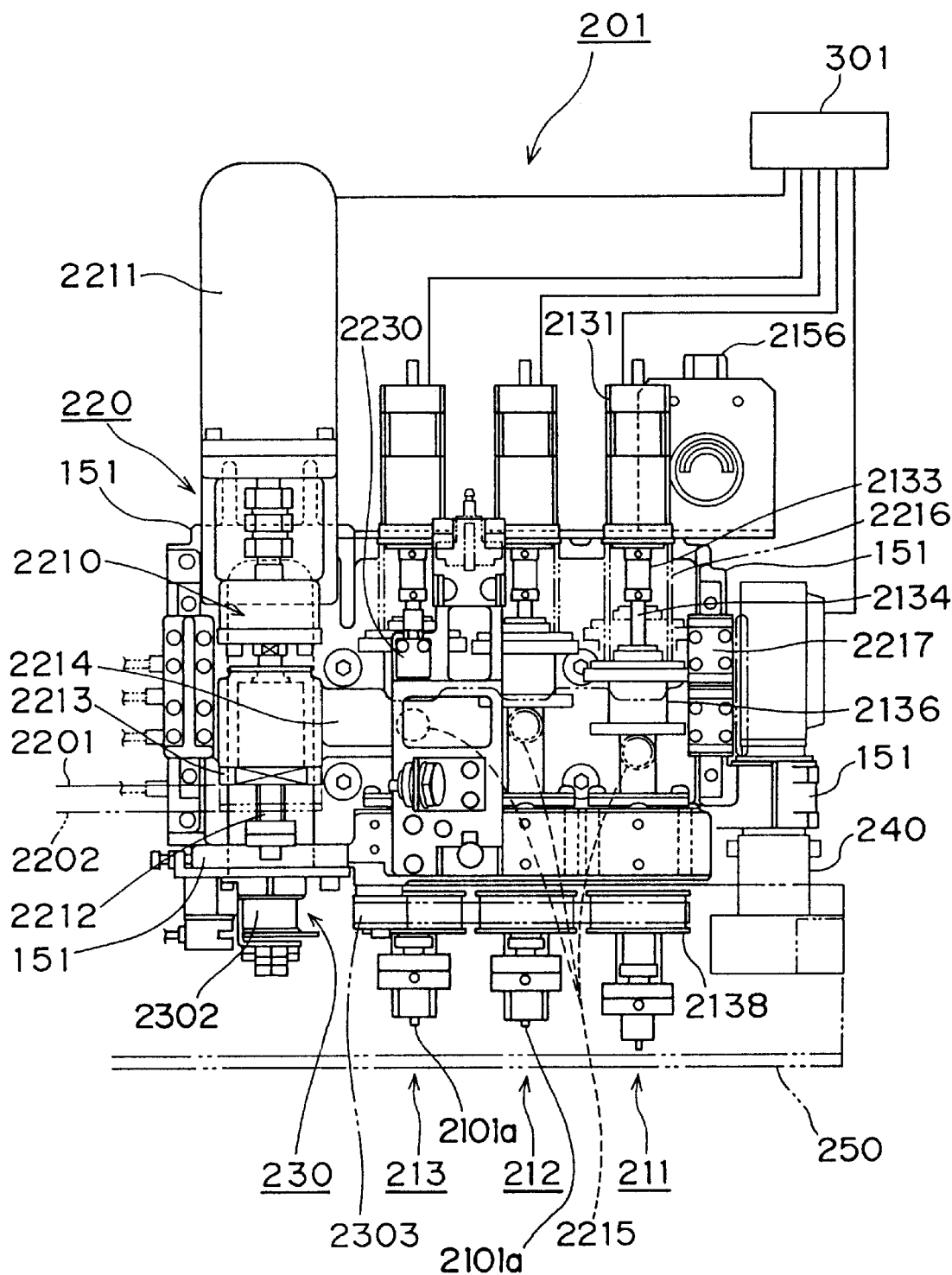
FIG. 3 is a front view of the adhesive application head unit of the adhesive applying apparatus in the embodiment of the present invention.
Figure 4:
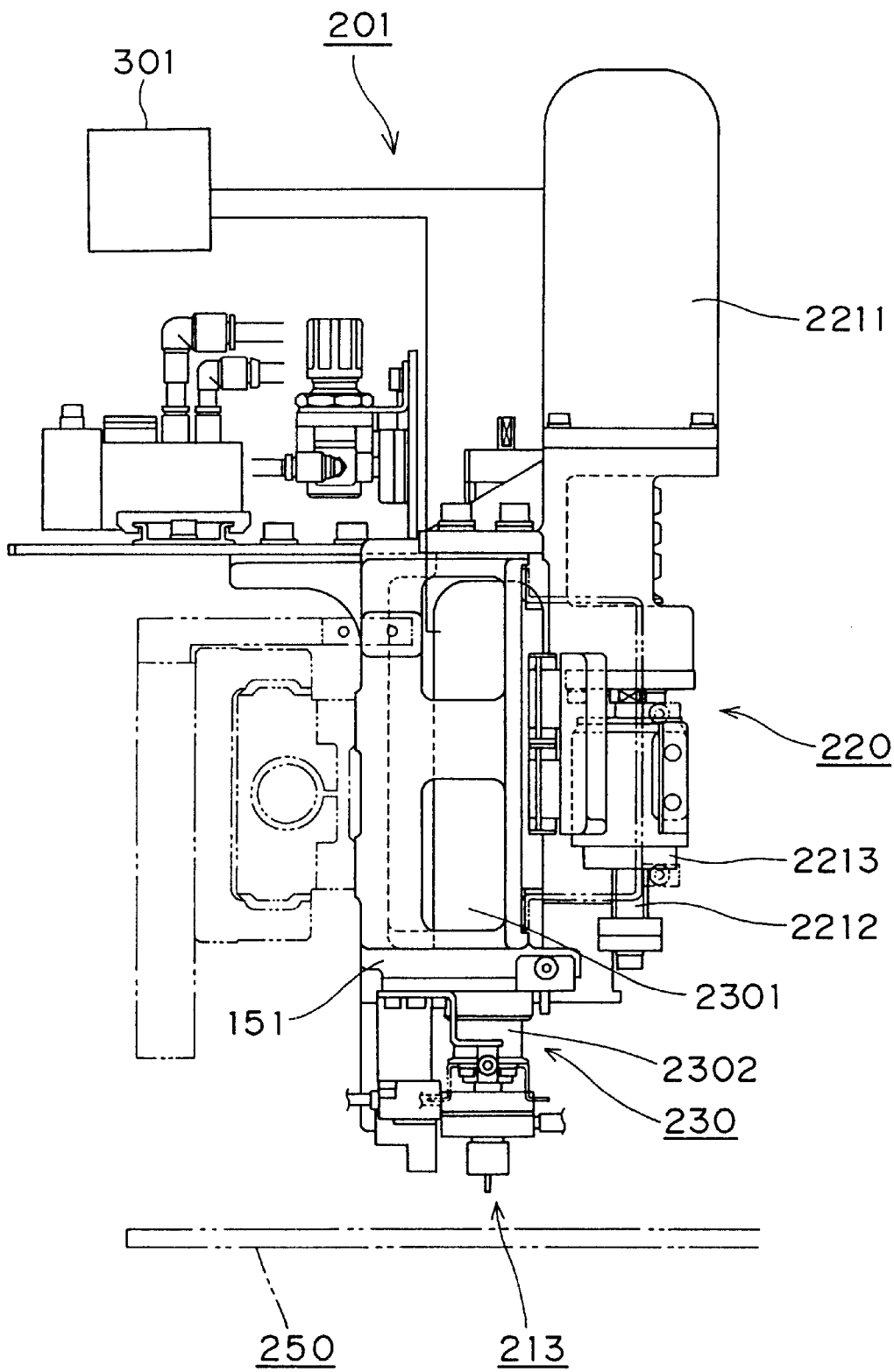
FIG. 4 is a left side view of the adhesive application head unit shown in FIG. 3.
Figure 5:
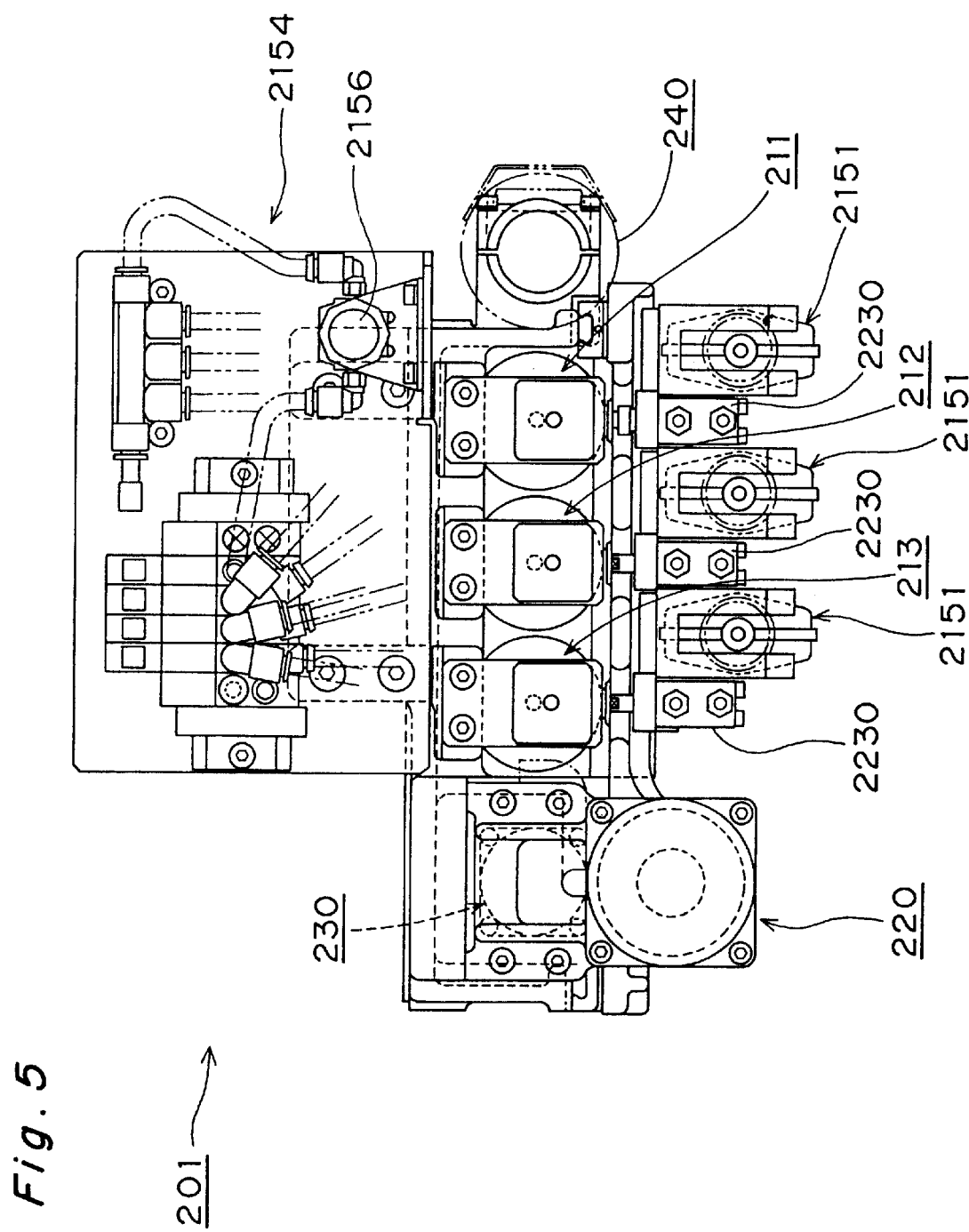
FIG. 5 is a plan view of the adhesive application head unit shown in FIG. 3.
Figure 6:
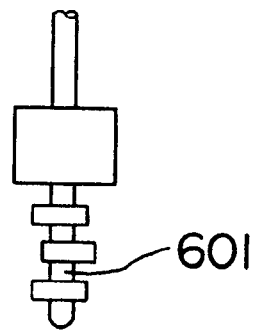
FIG. 6 is a diagram of a modified example of a screw portion of a discharge shaft shown in FIG. 1.
Figure 7:
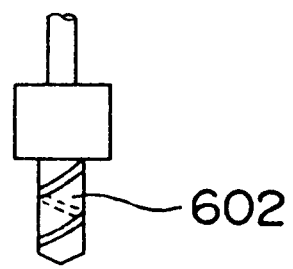
FIG. 7 is a diagram of a modified example of the screw portion of the discharge shaft shown in FIG. 1.
Figure 8:
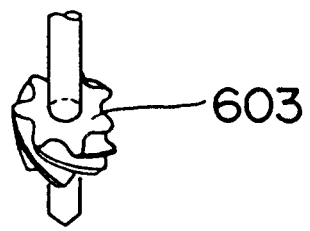
FIG. 8 is a perspective view of a modified example of the screw portion of the discharge shaft shown in FIG. 1.
Figure 9:
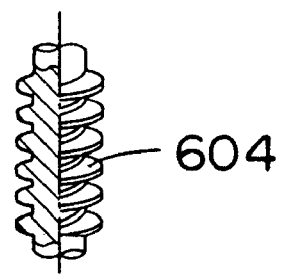
FIG. 9 is a perspective view of a modified example of the screw portion of the discharge shaft shown in FIG. 1.
Figure 10:
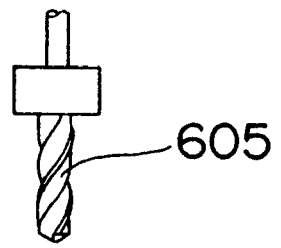
FIG. 10 is a diagram of a modified example of the screw portion of the discharge shaft shown in FIG. 1.

As shown, e.g., in FIG. 3, the adhesive application head unit 201 of the preferred embodiment has three sets of adhesive application heads 211–213, each having a nozzle 2101, which will be described later, from which is discharged an adhesive 251 from one end 2101a of the nozzle 2101. Also provided is single nozzle-moving device 220, which moves portions, including the nozzles 2101, of the adhesive application heads 211–213 between a standby position 2201 and an application position 2202 in an axial direction of the nozzle 2101. Further provided is a single adhesive application member-rotating device 230, which rotates an adhesive application member 2111, equipped with the nozzle 2101, in a direction about an axis of the nozzle 2101 for each adhesive application head 211–213. And, a single application size-detecting device 240, which detects each application size of the adhesive applied by each nozzle 2101, is also provided. In the embodiment, the axial direction of the nozzle 2101 is a direction parallel to a thickness-wise direction of a circuit board 250, that is, a vertical direction. The above constructions of the apparatus will be described below one by one.

First, the adhesive application heads 211–213 will be described.

A primary difference of the three sets of the adhesive application heads 211–213 is an amount of nozzles 2101 set at the adhesive application member 2111. The adhesive application head 211 has one nozzle 2101 set at the adhesive application member 2111, and the adhesive application head 212 has two nozzles 2101, whereas the adhesive application head 213 has four nozzles 2101. The adhesive application head 211 is representative of the adhesive application heads in the following description of the adhesive application heads.

Roughly, the adhesive application head 211 has the adhesive application member 2111 equipped with the nozzle 2101 for discharging the adhesive 251 from one end 2101a, a discharge shaft 2121 disposed coaxially with the nozzle 2101 in the axial direction of the nozzle 2101 and also disposed rotatably about an axis of the discharge shaft 2121 within the adhesive application member 2111, a discharge shaft-rotating device 2131 arranged at the side of the other end of the discharge shaft 2121 for rotating the discharge shaft 2121 in the direction about the axis thereof, and an adhesive feed device 2151 for supplying the adhesive 251 to the adhesive application member 2111.

One end portion of the discharge shaft 2121 is formed to be a screw portion 2122. The other end portion 2121a of the discharge shaft 2121 is coupled to one end portion of a rotation connection shaft 2134 in a state to be movable in the axial direction of the discharge shaft 2121 and rotatable in the same direction as a rotational direction about an axis of the rotation connection shaft 2134 in response to the rotation of the rotation connection shaft 2134. The other end portion of the rotation connection shaft 2134 is coupled by a coupling 2133 to an output shaft 2132 of the discharge shaft-rotating device 2131. In consequence of the operation of the discharge shaft-rotating device 2131, the discharge shaft 2121 rotates in the direction about the axis thereof via the output shaft 2132, coupling 2133 and rotation connection shaft 2134. The discharge shaft-rotating device 2131 of the embodiment is a motor connected to a control device 301. The operation of the discharge shaft-rotating device 2131 is controlled by the control device 301 to rotate by an angle θ which will be described in detail later to discharge the adhesive 251.

A path 2112 for supply of the adhesive 251 is provided in the adhesive application member 2111 at a position corresponding to one end portion 2122a of the screw portion 2122. A flexible adhesive feed piping 2152 of the adhesive feed device 2151 is connected to the path 2112, so that the adhesive 251 stored in a syringe 2153 of the adhesive feed device 2151 is supplied therethrough.

The screw portion 2122 of the discharge shaft 2121 is inserted into a screw insertion hole 2113 formed in the adhesive application member 2111 via a slight gap in a diametrical direction of the discharge shaft 2121, 0.1 mm in the embodiment, to an inner circumferential face of the screw insertion hole 2113. Accordingly, when the discharge shaft 2121 rotates about the axis thereof, the adhesive 251 supplied to one end portion 2122a of the screw portion 2122 is sent along threads of the screw portion 2122 to the other end portion 2122b of the screw portion 2122. The nozzle 2101 of the adhesive application member 2111 is formed coaxially with the discharge shaft 2121 to communicate with the screw insertion hole 2113. Thus, the adhesive 251 sent to the other end portion 2122b of the screw portion 2122 is further sent forward in the nozzle 2101 and then discharged out from the end 2101a of the nozzle 2101.

Figure 2:
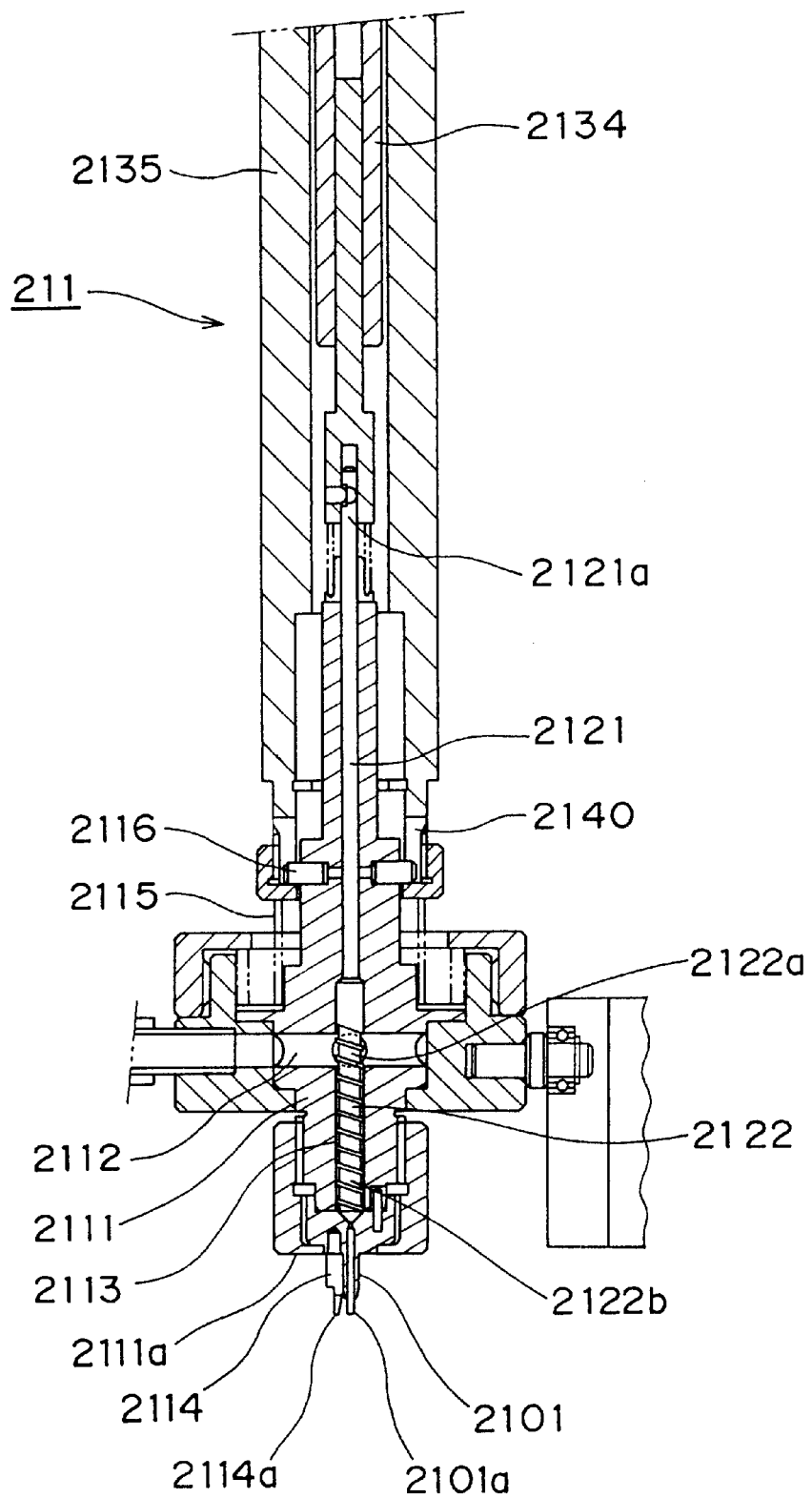
FIG. 2 is an enlarged sectional view of a nozzle portion in FIG. 1.
Figure 11:
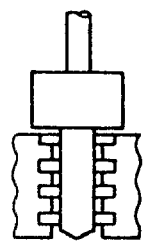
FIG. 11 is a diagram of a modified example of the screw portion of the discharge shaft shown in FIG. 1.

A form of the screw portion 2122 is not limited to the screw as shown in FIG. 2, for example, a stepped eccentric pin 601, a shaft 602 with a spiral groove, a helical gear-type shaft 603, a worm gear-type shaft 604, and a drill type shaft 605 as shown in FIGS. 6–10 may be employed. Alternatively, a groove may be formed in the inner circumferential face of the screw insertion hole 2113 of the adhesive application member 2111 without any processing carried out to the discharge shaft, as shown in FIG. 11.

A nozzle stopper 2114 extends adjacent to the nozzle 2101 and parallel to the nozzle 2101 at the adhesive application member 2111. A height of the nozzle stopper 2114 from an end face 2111a of the adhesive application member 2111 is slightly larger than a height of the nozzle 2101, specifically by 0.15 mm in the embodiment. The nozzle stopper 2114 acts to secure a slight gap between the circuit board 250 and the end 2101a of the nozzle 2101 when a leading end 2114a of the nozzle stopper 2114 comes into contact with, e.g.,the circuit board 250.

The adhesive application member 2111 and discharge shaft 2121 are constituted to be integrally movable in the axial direction.

For buffering an impact of the nozzle stopper 2114 in the axial direction when the nozzle stopper 2114 comes into contact touch with the circuit board 250, a buffer spring 2115 is fitted to the adhesive application member 2111 as shown in FIG. 2.

As described earlier, the adhesive application head 212 has two nozzles 2101, while the adhesive application head 213 has four nozzles 2101. In these cases, the nozzles 2101 are arranged concentrically about a center axis of the discharge shaft 2121. For example, the two nozzles 2101 of the adhesive application head 212 are separated by 180° and the four nozzles 2101 of the adhesive application head 213 are spaced every 90°. Needless to say, each nozzle 2101 and the screw insertion hole 2113 are adapted to communicate with each other.

The rotation connection shaft 2134 penetrates a spline shaft 2135 in a state to be slidable in an axial direction of the rotation connection shaft 2134 and rotatable about an axis of the shaft 2134. A movement member 2136 engaged with a constituting portion of the nozzle-moving device 220 is fixed at an end portion of the spline shaft 2135 located at the discharge shaft-rotating device 2131 side, and a spline housing 2137 is set at an end portion of the spline shaft 2135 located at the adhesive application member 2111 side. The spline housing 2137 supports the spline shaft 2135 in a manner to allow the spline shaft 2135 to slide in an axial direction thereof. At the same time, the spline housing 2137 is supported by a frame member 151 of the adhesive applying apparatus 101 via a bearing 2139 so that the spline shaft 2135 can rotate integrally with the spline housing 2137 in a direction about an axis of the spline shaft 2135. A pulley 2138 is set to the spline housing 2137, which is rotated by the adhesive application member-rotating device 230 in the direction about the axis of the spline shaft 2135. Accordingly, the spline housing 2137 rotates in the direction about the axis of the spline shaft 2135, thereby rotating the spline shaft 2135 in the same direction, that is, about the axis of the spline shaft 2135.

The spline shaft 2135 and adhesive application member 2111 are coupled by a coupling mechanism shown in FIG. 2. In accordance with the movement of the spline shaft 2135 in the axial direction thereof between the standby position 2201 and the application position 2202, the adhesive application member 2111 having the nozzle 2101 moves in the axial direction, i.e., in the axial direction of the nozzle 2101. Further, in accordance with the rotation of the spline shaft 2135 in the direction about the axis thereof, the adhesive application member 2111 rotates in the direction about the axis of the nozzle 2101.

The coupling mechanism comprises a pin 2116 projecting into the adhesive application member 2111 and an engagement groove 2140 formed in the spline shaft 2135 along the axial direction of the spline shaft 2135. The pin 2116 is engaged with the engagement groove 2140 in a state to be slidable in the axial direction of the spline shaft 2135. The coupling mechanism of this constitution enables the adhesive application member 2111 to move in the axial direction thereof under the buffering action, and also enables the rotation of the spline shaft 2135 in the direction about the axis thereof to be transmitted to the adhesive application member 2111.

The adhesive feed device 2151 comprises the syringe 2153 for storing the adhesive 251 thereinside as depicted earlier, the adhesive feed piping 2152 for guiding the adhesive 251 in the syringe 2153 to the adhesive application member 2111, and a compressed air feed device 2154 supplying compressed air into the syringe 2153 so as to extrude the adhesive 251 in the syringe 2153 to the adhesive feed piping 2152. A measuring device 2155 may be installed, for example, in the syringe 2153 for measuring physical properties of the adhesive 251, e.g., a temperature, a viscosity, etc. to make the amount of the adhesive 251 discharged through the nozzle 2101 controllable in accordance with the physical properties of the adhesive 251. The measuring device 2155 is connected to the control device 301. The compressed air feed device 2154 has a pressure regulator 2156, so that air of a predetermined pressure is supplied through a head portion of the syringe 2153 into the syringe 2153. The syringe 2153 is naturally tightly sealed so as not to allow the supplied compressed air to be leaked to outside of syringe 2153.

The nozzle-moving device 220 will be described.

The nozzle-moving device 220 moves a constituting member of each adhesive application head 211–213 such as the spline shaft 2135, the adhesive application member 2111, etc., excluding the discharge shaft-rotating device 2131, coupling 2133, rotation connection shaft 2134 and spline housing portion 2137, in the axial direction of the spline shaft 2135 between the standby position 2201 and application position 2202. The nozzle-moving device 220 has a driving unit 2210 and selecting units 2230 for selecting the adhesive application head to be moved.

In the driving unit 2210 of the embodiment are included an AC motor 2211 fixed to the frame member 151 of the adhesive applying apparatus 101, and a ball screw 2212 coupled to an output shaft of the motor 2211, extending parallel to the axial direction of the spline shaft 2135 and supported by the frame member 151 to be rotatable in a direction about an axis of the ball screw 2212. Also included is a ball screw nut 2213 engaged with the ball screw 2212, an arm 2214 having one end portion supported at the ball screw nut 2213 and movable between the standby position 2201 and application position 2202 in an axial direction of the ball screw 2212, cam followers 2215 set to the arm 2214 and engaged with the movement members 2136 of the adhesive application heads 211–213, and springs 2216 urging and pressing the movement members 2136 towards the corresponding cam followers 2215. The motor 2211 is connected to the control device 301 and controlled in operation by the control device 301. The other end portion of the arm 2214 is supported by a linear movement mechanism 2217 which is mounted to the frame member 151 of the adhesive applying apparatus 101 and slidable in a direction parallel to the axial direction of the spline shaft 2135.

At the driving unit 2210 as described above, when the motor 2211 is operated, the ball screw 2212 rotates in the direction about the axis thereof and accordingly the arm 2214 set to the ball screw nut 2213 is moved between the standby position 2201 and application position 2202 in accordance with the direction of the rotation. Since the movement member 2136 is urged by the spring 2216 to the cam follower 2215, the movement member 2136, i.e. the constituting member of the adhesive application head such as the spline shaft 2135, adhesive application member 2111 and the like are moved between the standby position 2201 and application position 2202 in accordance with the movement of the cam follower 2215 set to the arm 2214 between the standby position 2201 and application position 2202.

The selecting units 2230 corresponding, to not selected adhesive application heads among the adhesive application heads 211–213 position the constituting members such as the spline shafts 2135 and adhesive application members 2111, etc. of the not selected adhesive application heads to the standby position 2201. Each selecting unit 2230 is secured to the frame member 151 at a position corresponding to the standby position 2201. Each of the selecting units 2230 is constituted of an air cylinder which is connected to the control device 301 and controlled in operation by the control device 301. The air cylinder moves a pin 2233 back and forth between an engagement position 2231 and a retreat position 2232 in a direction orthogonal to the axial direction of the spline shaft 2135. The selecting unit 2230 positions the pin 2233 at the engagement position 2231 when the movement member 2136 of the not selected adhesive application head, i.e. the adhesive application head not performing an application operation, is present at the standby position 2201, thereby engaging the pin 2233 with the movement member 2136 and restricting the movement of the constituting member such as the spline shaft 2135, adhesive application member 2111, etc. to the application position 2202. On the other hand, the selecting unit 2230 positions the pin 2233 at the retreat position 2232 for the selected adhesive application head, i.e. the adhesive application head carrying out the application operation, thus not impeding the spline shaft 2135, adhesive application member 2111, etc. to move to the application position 2202.

According to the thus-constituted nozzle-moving device 220, only the spline shaft 2135, adhesive application member 2111, etc. of the selected adhesive application head selected by the control device 301 can be moved between the standby position 2201 and application position 2202.

The adhesive application member-rotating device 230 will be described hereinbelow.

The adhesive application member-rotating device 230 rotates the constituting member such as the spline shaft 2135, adhesive application member 2111, etc. in the direction about the axis via the spline housing 2137 for each adhesive application head 211–213. The rotating device 230 has a motor 2301, a pulley 2302 set to an output shaft of the motor 2301 for rotating in a direction about an axis of the output shaft, and a timing belt 2303 transmitting the rotation of the pulley 2302 to the pulleys 2138 of the spline housings 2137 of the adhesive application heads 211–213. The motor 2301 is fixed to the frame member 151 of the adhesive applying apparatus 101 and connected to the control device 301 which controls the operation of the motor.

In the above-described adhesive application member-rotating device 230, the output shaft of the motor 2301 rotates by a predetermined angle about the axis of the output shaft under the control of the control device 301. The amount of the rotation is transmitted to the pulleys 2138 of the spline housings 2137 of the adhesive application heads 211–213 via the pulley 2302 and timing belt 2303. The constituting members such as the spline shafts 2135, adhesive application members 2111, etc. of the adhesive application heads 211–213 can accordingly be rotated simultaneously by the predetermined angle in the direction about the axes of the spline shafts 2135.

The above rotation of the constituting member such as the spline shaft 2135, adhesive application member 2111, etc. brings about the following effects. That is, in the adhesive application heads 212, 213 having a plurality of nozzles 2101, the adhesive 251 can be spotted at integral multiple points of the nozzles 2101, for example, two points, four points, etc. in the case of the adhesive application head 212 having two nozzles 2101, which is convenient when the electronic component of a large size is to be bonded. This manner of application of the adhesive 251 to integral multiple points by each adhesive application head 212, 213 having a plurality of nozzles 2101 as described above will be denoted as a multipoint application hereinafter. Also in the adhesive application head 211 with one nozzle 2101 arranged along a rotational central axis, even when the nozzle stopper 2114 comes into contact with, e.g., the wiring pattern formed on the circuit board 250, the above rotation enables the nozzle stopper 2114 to shift to a position so as not to come into contact with the wiring pattern.

The application size-detecting device 240 will be discussed below.

The application size-detecting device 240 detects an application size of the adhesive 251 applied on, for instance, a test tape. The application size-detecting device 240 is constituted of a recognition camera in the present embodiment. The application size-detecting device 240 is connected to the control device 301. The control device 301 obtains the application size based on application size information sent from the application size-detecting device 240, thereby controlling the operation of the discharge shaft-rotating device 2131; specifically, controlling the amount of the rotation of the discharge shaft 2121 in the direction about the axis to control the amount of the adhesive 251 discharged from the nozzle 2101.

The control device 301 will now be depicted.

Figure 13:
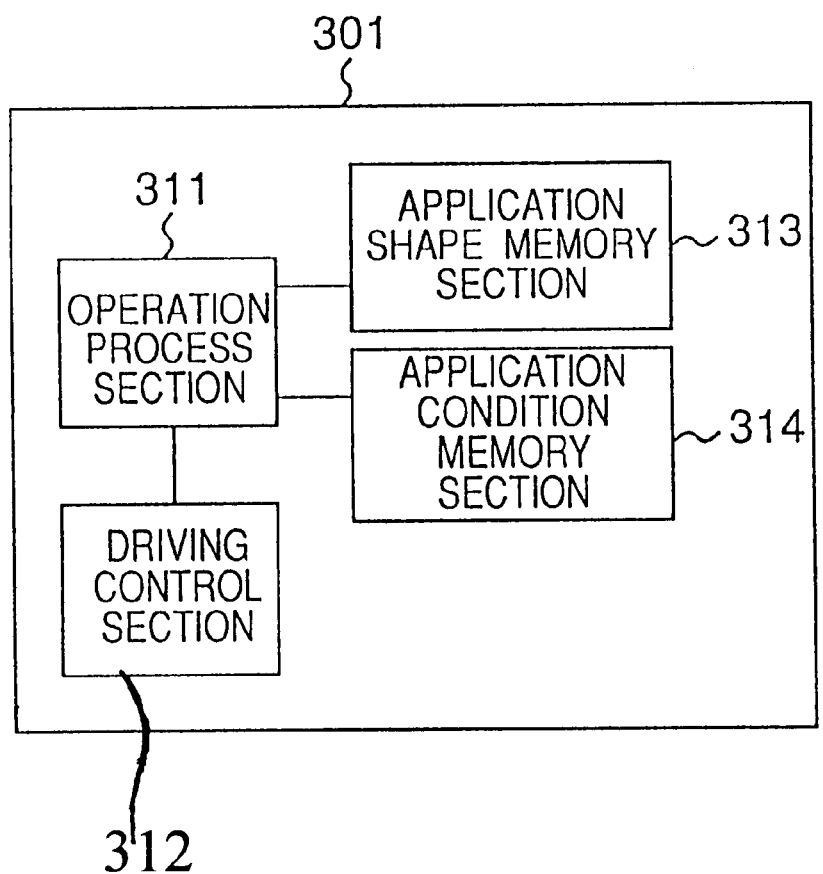
FIG. 13 is a block diagram showing the constitution of a control device provided in the adhesive applying apparatus of FIG. 12.

As shown in FIG. 13, the control device 301 is divided at least into an operation process section 311, a driving control section 312, an application shape memory section 313 and an application condition memory section 314. The application shape memory section 313 stores information of a relationship of application shapes and application diameters. The relationship information of the application shapes and application diameters may be stored beforehand in the application shape memory section 313, or read out via a memory medium, e.g., floppy disk, etc., or a communication line.

The application condition memory section 314 stores information, as will be described hereinbelow, of a relationship between kinds of adhesives 251 and amounts of the rotation of the discharge shaft-rotating device 2131, and similar various application conditions. The application condition information may be stored in the application condition memory section 314 beforehand or read out via a memory medium such as a floppy disk, etc., or a communication line.

Figure 14:
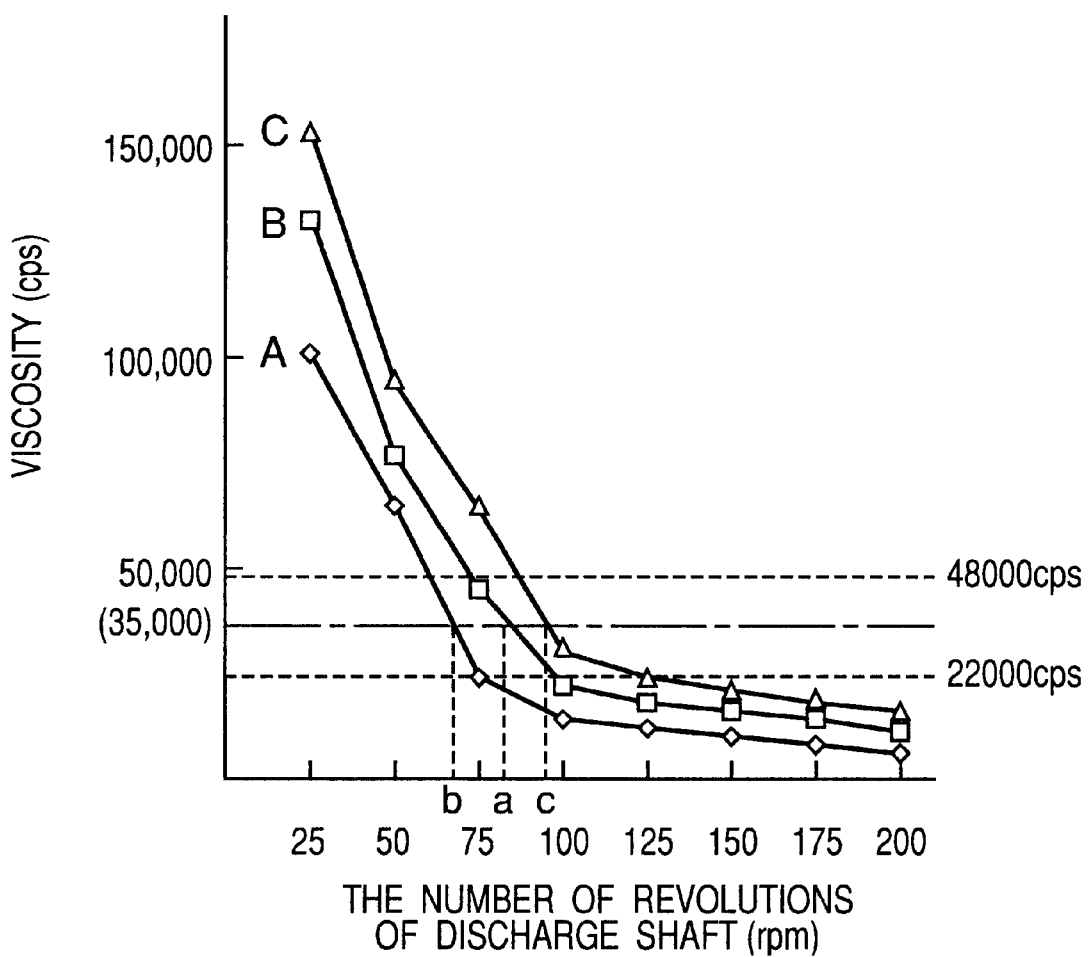
FIG. 14 is a graph indicating a relationship of the number of revolutions of the discharge shaft the adhesive application head unit of FIG. 1 and viscosities of adhesives.

The relationship information of the application shapes and amounts of the rotation will be described. As shown in FIG. 14, although a viscosity characteristic differs depending on the rotational amount of the discharge shaft 2121 and a material of the viscous fluid, e.g., adhesive 251, used in the apparatus of the embodiment, a viscosity band where the fluid can be discharged stably is present. In FIG. 14, the viscosity band is supposed to be 22000–48000 cps. An average value of the viscosity band, 35000 cps in the example, is set as a reference viscosity, and a rotational speed of the discharge shaft 2121, at which the shaft can discharge the viscous fluid stably at the reference viscosity, is set for each viscous fluid. In the example, the rotational speed is 82 rpm for a viscous fluid A, 62 rpm for a viscous fluid B, and 94 rpm for a viscous fluid C. A relationship between the application diameter and a rotation time of the discharge shaft 2121 at each rotational speed is set for each viscous fluid as shown in FIG. 15. The thus-obtained information pertaining to the relationship of the application shapes and rotation amounts is stored in the application condition memory section 314.

The operation process section 311 obtains a drive time of the discharge shaft 2121 on the basis of the information of the kind of the viscous fluid used and a target-application-diameter from the application condition memory section 314. For example, in order to obtain the application diameter of 0.75 mm with the viscous fluid A, the discharge shaft 2121 should be driven at the rotational speed of 82 rpm for 15 ms.

The operation process section 311 also decides the application diameter for the applied, e.g., adhesive 251 by comparing the application size information supplied from the application size-detecting device 240 with the relationship information of the application shapes and application diameters stored in the application shape memory section 313. The operation of the operation process section 311 will be detailed hereinafter.

The driving control section 312 controls the operation of the discharge shaft-rotating device 2131 by the control from the operation process section 311. Moreover, the driving control section 312 controls operations of the Y-table 120, X-robot unit 121, AC motor 2211 and motor 2301 to apply the adhesive 251 to a predetermined position on the circuit board 250.

The control device 301 executes an operation control as follows, which is one of the features of the present embodiment. AS described earlier, the adhesive 251 is discharged from the nozzles 2101 at the adhesive application heads 211–213 consequent to the rotation of the discharge shafts 2121 in the direction about the axis thereof. Needless to say, the adhesive application member 2111 in which the discharge shaft 2121 is inserted does not rotate in the direction about the axis at this time. Although the adhesive application member 2111 can be rotated in the direction about the axis, for example, in order to change an arrangement position of the nozzle stopper 2114, if the adhesive application member 2111 alone is rotated while the discharge shaft 2121 is stopped, the operation eventually results the same as when the discharge shaft 2121 is rotated relative to the adhesive application member 2111. That is, the adhesive 251 may be discharged from the end 2101a of the nozzle 2101 depending on the viscosity of the adhesive 251.

For avoiding this problem, the control device 301 controls the rotational amount of the discharge shaft 2121 in the same direction as the rotational direction of the adhesive application member 2111 in accordance with the viscosity of the adhesive 251 so as to prevent the adhesive 251 from being discharged from the end 2101a of the nozzle 2101 consequent to the rotation of the adhesive application member 2111.

The above-described operation of the control device 301 will be specified in the description below.

The adhesive applying apparatus 101 of the embodiment in the above constitution operates in the following manner. As mentioned earlier, the adhesive applying apparatus 101 operates under the control of the control device 301.

The circuit board 250 is carried in and set at the Y-table 120 of the adhesive applying apparatus 101. A sequence of steps 1–11 shown in FIG. 16 (the step is denoted by "S" in FIG. 16) is executed once or repeatedly correspondingly to the electronic component to be mounted to the circuit board 250. After a predetermined application operation for the adhesive 251 onto the circuit board 250 is finished, the circuit board with the adhesive applied thereto is sent to a next step. Then, a fresh circuit board 250 is carried into the adhesive applying apparatus 101.

The steps 1–11 will be described with reference to FIGS. 16–19. The nozzle 2101 is arranged at the standby position 2201 by the nozzle-moving device 220 in step 1.

In step 2, for preventing the nozzle stopper 2114 from interfering with the wiring pattern on the circuit board 250 as mentioned earlier, or for applying the adhesive 251 at more points, i.e., the multipoint application as referred to before, it is detected whether the adhesive application member 2111, namely, the nozzle 2101 and nozzle stopper 2114 are to be rotated in the direction about the axis of the discharge shaft 2121. In other words, as described above, the information pertaining to the electronic components is supplied to the control device 301, and also information of a correspondence of application positions and electronic components to be bonded at the application positions, as well as an application order of the adhesive to the application points, etc. are supplied to the control device 301. The control device 301 detects, on the basis of this information, whether or not the rotation for preventing the interference or for achieving the multipoint application is necessary when the above rotation is detected to be unnecessary, step 2 is followed immediately by step 4, when the above rotation is detected to be necessary, step 2 is followed immediately by step 3.

Figure 19:
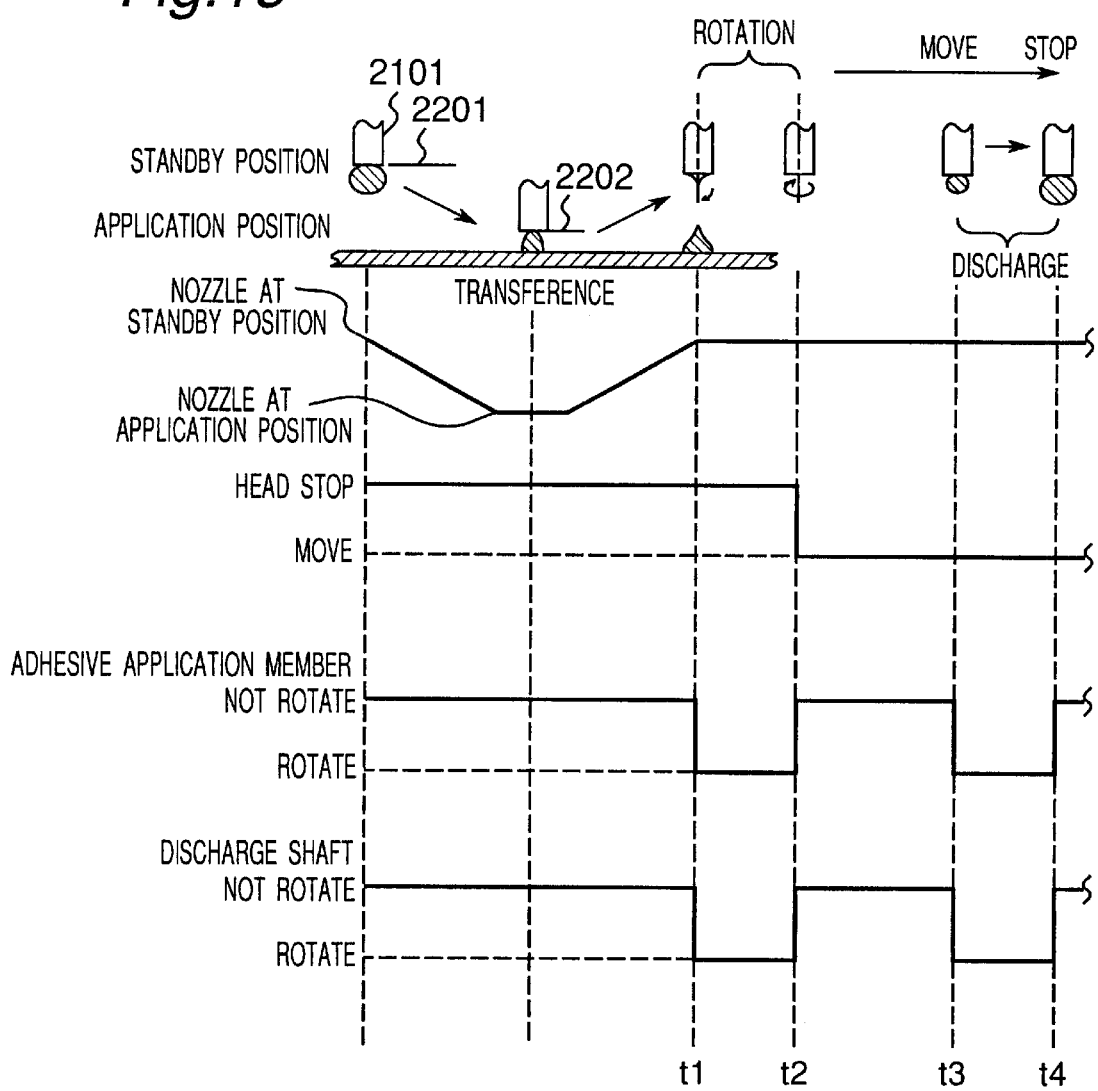
FIG. 19 is a process diagram and a timing chart of the operation shown of FIG. 16.

In step 3, the control device 301 obtains the rotational angle θ of the adhesive application member 2111 on the basis of the information pertaining to the electronic components, correspondence information, etc. and drives the adhesive application member-rotating device 230 from a time point t1 to a time point t2 shown in FIG. 19 so that the adhesive application member 2111 rotates by the rotation angle θ in the direction about the axis of the discharge shaft 2121. As a result, the adhesive application member 2111 is rotated by the rotational angle θ via the timing belt 2303.

Further, since the adhesive 251 may be discharged from the nozzle 2101 in the event that only the adhesive application member 2111 is rotated while the discharge shaft 2121 is stopped as described before, the control device 301 operates the discharge shaft-rotating device 2131 from the time point t1 to the time point t2 of FIG. 19, thereby rotating the discharge shaft 2121 by the rotational angle θ in the same direction as the rotational direction of the adhesive application member 2111 at a relative rotational speed between a rotational speed of the adhesive application member 2111 and that of the discharge shaft 2121 of zero. Depending on the kind and viscosity of the viscous fluid to be applied, the discharge shaft 2121 is not required to be rotated, the rotation angle of the discharge shaft 2121 may not agree with the rotational angle of the adhesive application member 2111, the above relative speed may not be zero, the rotational start time point and rotational end time point may be made different between the adhesive application member 2111 and discharge shaft 2121, or like modifications may be considered. A correspondence relationship information of operation states of the adhesive application member 2111 and discharge shaft 2121 is stored for every viscous fluid or for every viscosity in the control device 301, so that the control device 301 controls the operation related to the above rotation of the adhesive application member 2111 and discharge shaft 2121 in conformity with the correspondence relationship information.

In step 4, the Y-table 120 and X-robot unit 121 operate thereby positioning, e.g. the adhesive application head 211, to the application position on the circuit board 250 where the adhesive 251 is to be applied. At this time, while all nozzles 2101 of the three adhesive application heads 211–213 are set at the standby position 2201, the adhesive application head 211 is selected in the example through the operation of the selecting unit 2230. That is, the pin 2233 of the selecting unit 2230 in the adhesive application head 211 is located at the retreat position 2232 and therefore disengaged from the movement member 2136. On the other hand, pins 2233 of the selecting units 2230 in the other adhesive application heads 212, 213 are placed at the engagement position 2231 and engaged with the movement members 2136. Therefore, on this occasion, only the nozzle 2101 of the adhesive application head 211 can be brought to the application position 2202 by. the driving of the nozzle-moving device 220.

As will be described below, in step 5, the discharge shaft-rotating device 2131 is driven on the basis of a drive time and a drive speed set for the discharge shaft 2121 at an application condition setting operation to a sample board or the test tape which, is carried out before the adhesive is applied to the circuit board 250, i.e., before the start of production, or when the application diameter is recognized to change after the start of production when the discharge shaft-rotating device 2131 is driven, as described above, the discharge shaft 2121 is rotated in the direction about the axis thereof, and accordingly, the adhesive 251 is discharged from the one end 2101a of the nozzle 2101. At a time point when a predetermined amount of the adhesive 251 is discharged under the control of the control device 301, namely, when the drive time is completed, the driving of the discharge shaft-rotating device 2131 is stopped (step 6). As a result of this, the predetermined amount of the adhesive 251 is accumulated at the one end 2101a of the nozzle 2101.

The application condition setting operation referred to hereinabove will be described.

Figure 17:
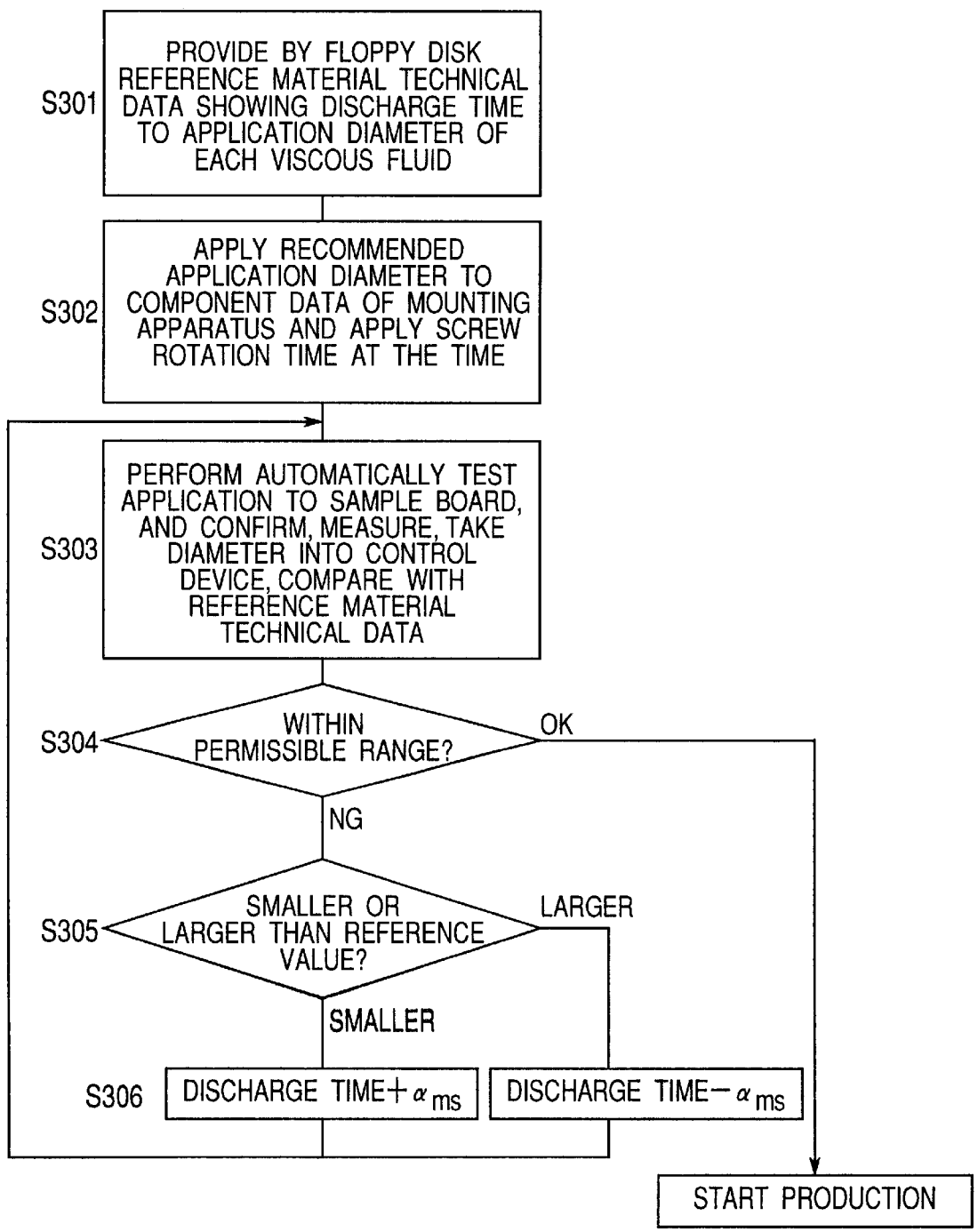
FIG. 17 is a flow chart of a correction operation shown in the operation in FIG. 16 for the rotation time of the discharge shaft.

The application condition setting operation before the start of production is indicated in FIG. 17. According to the application condition setting operation of FIG. 17, the information is not stored preliminarily in the application condition memory section 314 of the control device 301, but reference material technological information representing the relationship of application diameters and drive times of the discharge shaft 2121 for every viscous fluid is taken, for instance, from a floppy disk and supplied to the control device 301, as is clear from step 301. The application condition memory section 314 accordingly stores information of application diameters required for electronic components for every electronic component to be mounted to the circuit board 250, instead of the relationship information of application diameters and drive times. In step 302, the operation process section 311 decides the drive time and drive speed of the discharge shaft-rotating device 2131 for every viscous fluid corresponding to each electronic component on the basis of the application diameter information. In step 303, the discharge shaft-rotating device 2131 is driven in compliance with the obtained drive time and drive speed for the viscous fluid to be applied, e.g., the viscous fluid A, whereby the viscous fluid A is discharged from the nozzle 2101 and accumulated at the one end 2101a of the nozzle 2101. Then, the nozzle-moving device 220 is driven, thereby moving the nozzle 2101 to the application position 2202 from the standby position 2201 to apply the viscous fluid A at the one end 2101a onto the sample board. The viscous fluid A applied onto the sample board is picked up by the application size-detecting device 240, and the application size is obtained by the control device 301. The obtained actual application size is compared with a target-application-size in the reference material technological information. In step 304, a determination is made as to whether or not the actual application size is included within a permissible range of the target-application-size. If the actual application size is within the permissible range, the drive time is used as it is and then the production is started. On the other hand, if the actual application size is not included within the permissible range, in step 305 a determination is made as to whether the actual application size is larger or smaller than the target-application-size when the actual application size is smaller, the drive time is set longer by α ms. When the actual application size is larger than the target-application-size, the drive time is made shorter by α ms in step 306. Step 306 then returns to step 303. Operations in steps 303–306 are repeated with the drive time set as above. The drive time is thus set properly.

Figure 18:
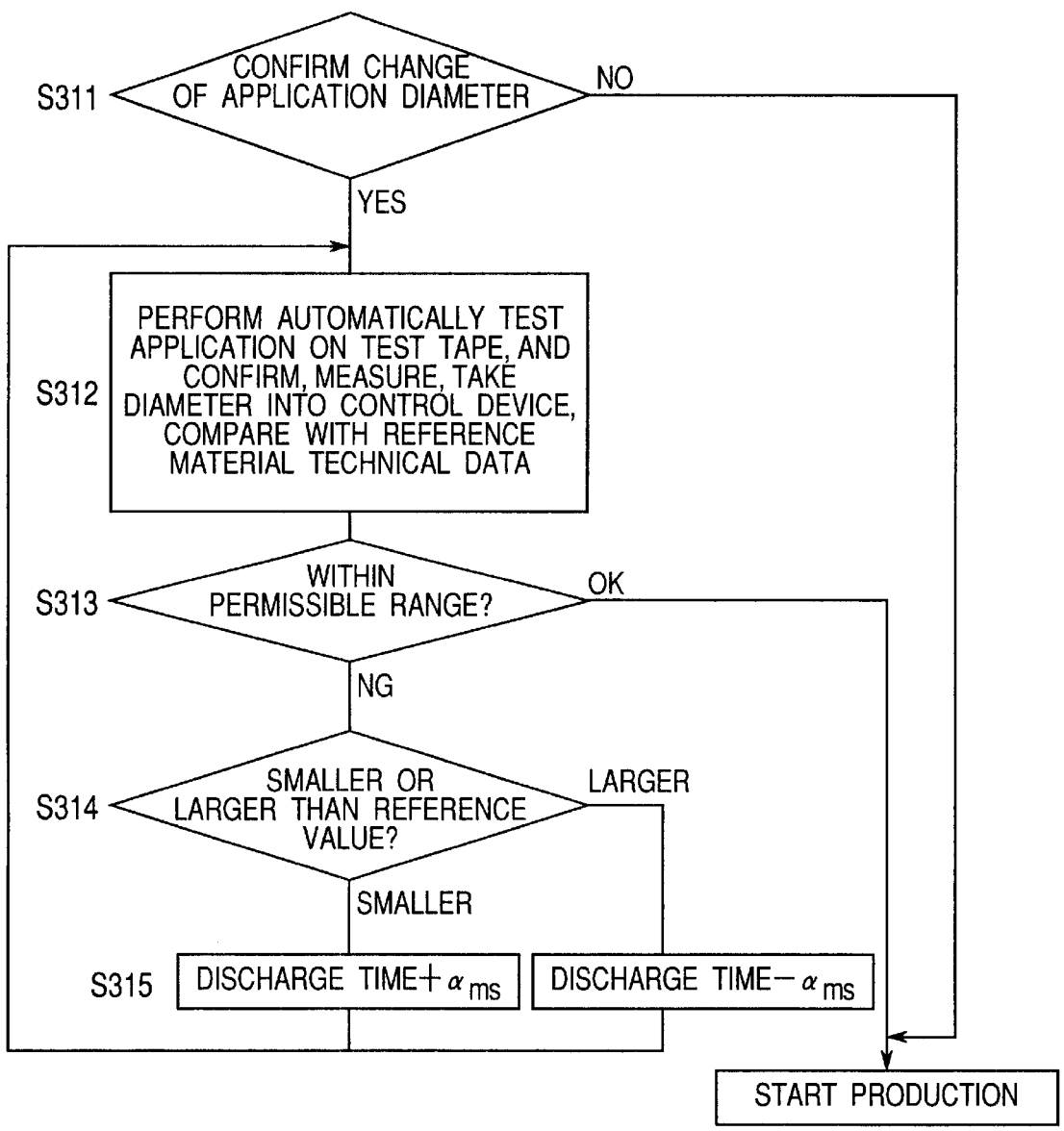
FIG. 18 is a flow chart of the correction operation in the operation shown in FIG. 16 for the rotation time of the discharge shaft.

After the start of production, the application diameter may change because of a change or a difference of lots of the viscous fluid used, a change of an ambient temperature, a change of an inner diameter of the nozzle 2101 due to a clog of the nozzle, or a change of the gap between the one end 2101a of the nozzle 2101 and the circuit board 250 resulting from abrasion of the leading end of the nozzle stopper 2114, etc. The application condition setting operation after the start of production is indicated in FIG. 18. Specifically, if the change of the application diameter is confirmed in step 311, the application operation onto the circuit board 250 is once interrupted, and the application to the test tape is conducted in step 312. An applied portion is picked up to determine the application diameter which is then compared with the target-application-size, similar to the operation in step 303. The operation afterwards is the same as in steps 304–306, namely, steps 313–315 are executed, whereby the drive time is set properly.

Figure 16:
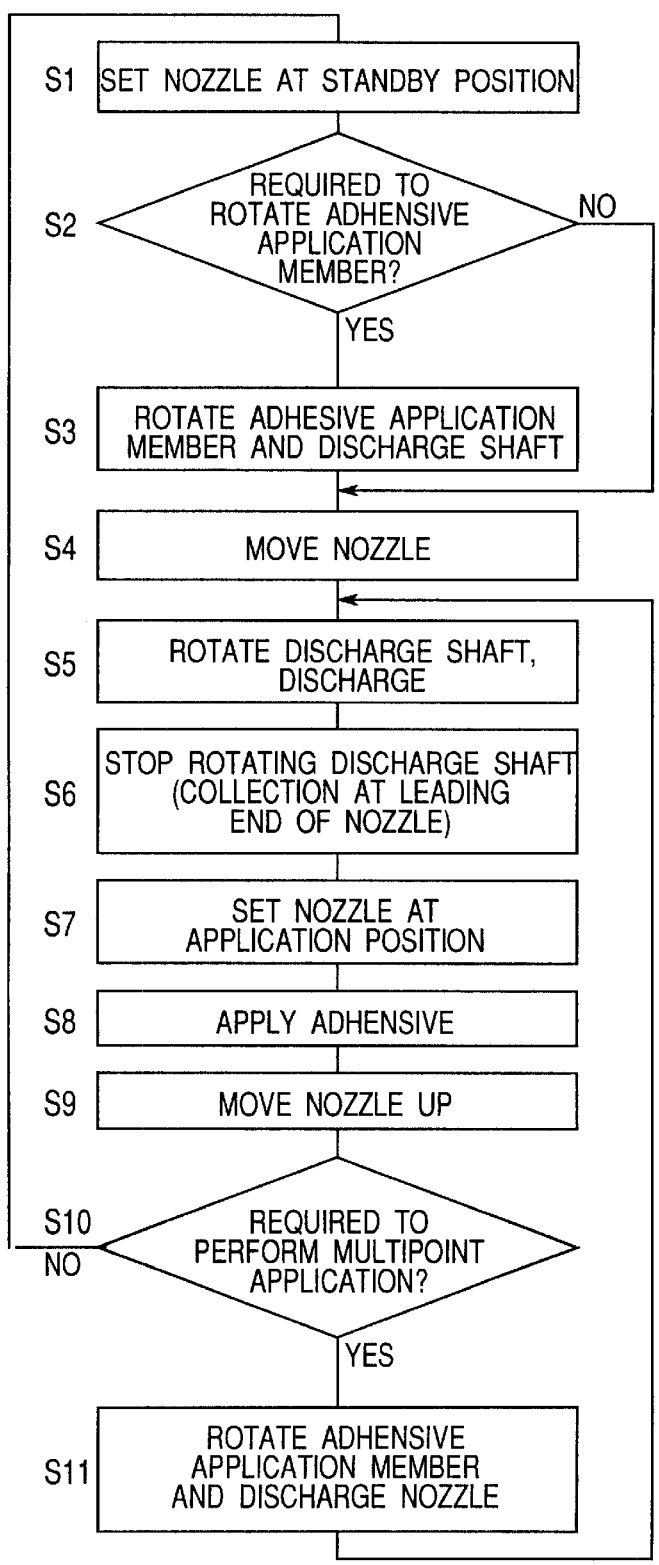
FIG. 16 is a flow chart showing the operation of the adhesive applying apparatus of the embodiment of the present invention.

Referring back to explanation of the operation shown in FIG. 16, in step 7, the nozzle-moving device 220 is driven and the movement member 2136 of the adhesive application head 211, in other words, the spline shaft 2135 and adhesive application member 2111 having the nozzle 2101 are moved from the standby position 2201 to the application position 2202. In the embodiment, the movement from the standby position 2201 to the application position 2202 corresponds to a downward movement. The adhesive 251 stored at the one end 2101a of the nozzle 2101 is transferred and applied to the predetermined position of the circuit board 250 in step 8. After the application, the nozzle-moving device 220 is driven in step 9, and the movement member 2136, namely, the spline shaft 2135 and adhesive application member 2111 with the nozzle 2101 are moved upward from the application position 2202 to the standby position 2201.

In step 10, whether the multipoint application is to be carried out or not is judged. In the case where the multipoint application is not required, the operation goes back to step 1, if the multipoint application is to be performed, step 11 is started. In step 11, similar to the operation in step 3, at least for the adhesive application member 2111, in this embodiment, adhesive application member 2111 and discharge shaft 2121 are rotated in the direction about the axis of the discharge shaft 2121. The rotational angle in step 11 is not limited to be equal to the above θ and is determined by the control device 301.

The operation returns to step 5 after step 11, and steps 5–11 are repeated.

In the foregoing description of the operation, the discharge shaft 2121, that is, the screw portion 2122 is supposed to not be changed. Naturally, however, the screw portion 2122 may be changed corresponding to the viscous fluid. In such a case, the control device 301 is adapted to store the relationship information of application shapes and application diameters, and relationship information of the adhesive 251 and rotational amounts of the discharge shaft-rotating device 2131, etc., for each kind of the screw portion 2122.

Figure 20:
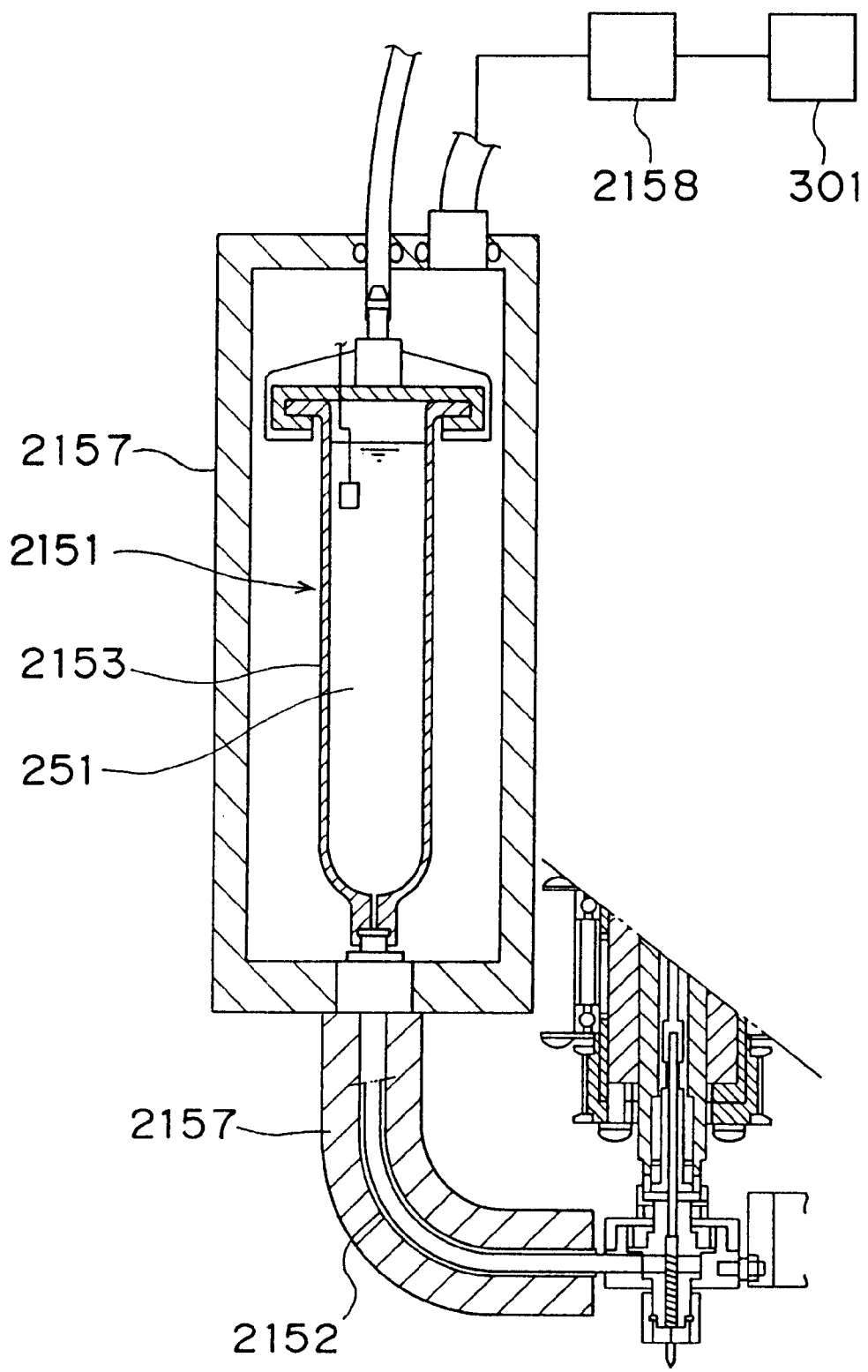
FIG. 20 is a diagram of a modified example of an adhesive feed device portion of the adhesive application head unit of FIG. 1.

In the event that because of physical properties of the viscous fluid, the proper application diameter cannot be achieved even by rotational control of the discharge shaft 2121 by the discharge shaft-rotating device 2131, and the change of the screw portion 2122, or a use environment of the adhesive-applying apparatus 101 greatly affects the viscous fluid, the adhesive feed device 2151 may be enclosed as shown in FIG. 20 by a heat insulator 2157. Moreover, a temperature of the viscous fluid included in the adhesive feed device 2151 is controlled by a temperature regulator 2158 controlled by the control device 301, thereby controlling the viscosity of the viscous fluid.

Figure 21:
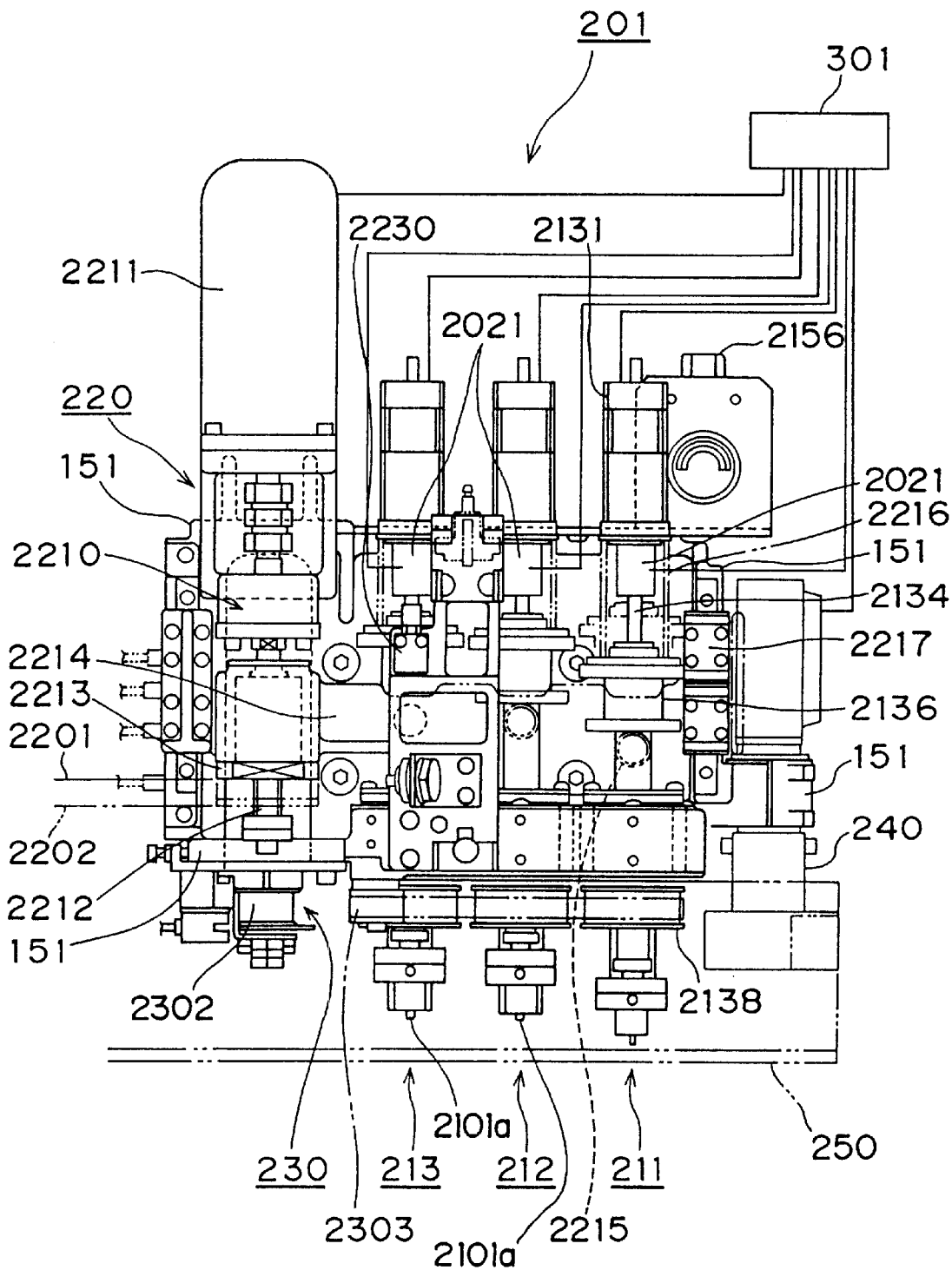
FIG. 21 is a front view of a modified example of the adhesive application head unit of FIG. 1.

In the above-described embodiment, the discharge shaft 2121 is also rotated about the axis thereof so as not to leak the adhesive 251 from the nozzle 2101 when the adhesive application member 2111 is rotated by the angle θ in steps 3 and 11. However, the method for preventing the adhesive 251 from being discharged from the nozzle 2101 is not limited to this. For instance, as in an adhesive application head unit 202 shown in FIG. 21, a connection-shutting device 2021 like a clutch mechanism can be set between the output shaft 2132 of the discharge shaft-rotating device 2131 and the rotation connection shaft 2134, when it is required to discharge the adhesive 251 from the nozzle 2101, the output shaft 2132 is connected to the rotation connection shaft 2134 by the connection-shutting device 2021. While, when the adhesive application member 2111 is to be rotated by the angle θ in steps 3 and 11, the connection between the output shaft 2132 and the rotation connection shaft 2134 is terminated, thereby enabling the discharge shaft 2121 to rotate freely about the axis thereof. In this arrangement, the discharge shaft 2121 is integrally rotated with the adhesive application member 2111 owing to the viscosity of the adhesive 251 present at the screw portion 2122 when the adhesive application member 2111 is rotated by the angle θ. In consequence, no relative rotation is brought about between the adhesive application member 2111 and the discharge shaft 2121, so that the adhesive 251 is prevented from being discharged from the nozzle 2101.

According to the present embodiment wherein the adhesive applying apparatus 101 is employed as an example apparatus to spot the adhesive 251 onto the circuit board 250, the discharge shaft 2121 is not rotated about the axis thereof when the adhesive 251 is applied. The embodiment is not limited to the above form and can be modified so that the discharge shaft 2121 is rotated about the axis thereof during the application of the viscous fluid.

For example, FIGS. 22–25 indicate a sealant application operation by a sealant applying apparatus 501 based on a technical concept that the application amount of the viscous fluid is controlled on the basis of a relationship of physical properties of the viscous fluid and the rotational time of the discharge shaft about the axis thereof in the above embodiment. Although a fundamental structure of the sealant applying apparatus 501 is similar to that of the above adhesive applying apparatus 101, a nozzle 502 having a bend at one end portion of the nozzle 502 is provided in place of the nozzle 2101.

Figure 22:
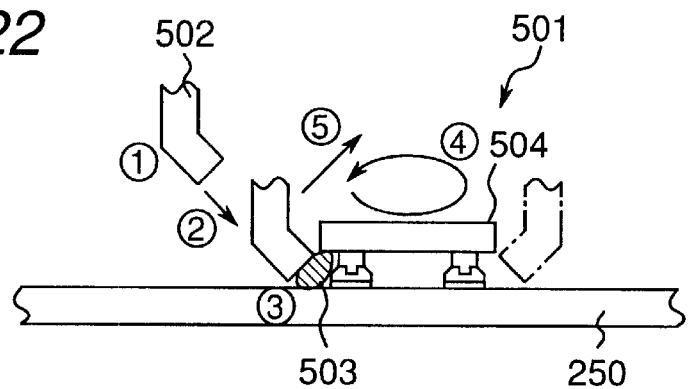
FIG. 22 is a diagram of an application operation of a sealant applying apparatus according to a different embodiment of the present invention.
Figure 23:
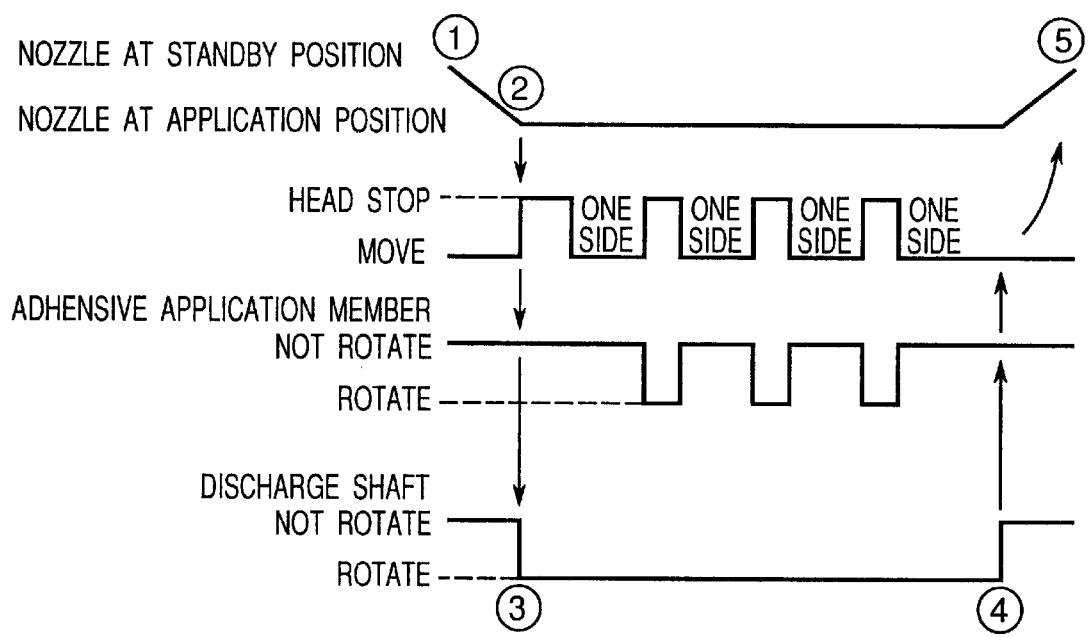
FIG. 23 is a timing chart of the operation of the sealant applying apparatus of FIG. 22.

The application operation for a sealant in the sealant applying apparatus 501 schematically is as follows, as shown in FIGS. 22 and 23. That is, the nozzle 502 is moved from the standby position designated by ① to the application position indicated by ②. The discharge shaft 2121 is rotated about the axis thereof at the application position, thereby discharging a sealant 503 continuously from one end of the nozzle 502 as indicated by ③. At the same time, as shown by ④, a member corresponding to the adhesive application member 2111 is rotated to change an arrangement of the nozzle 502 and, the Y-table 120 and X-robot unit 121 are driven to move the one end of the nozzle 502 to trace the whole periphery of an IC chip 504. The rotation of the discharge shaft 2121 is stopped to stop the sealant 503 from being discharged when the one end of the nozzle 502 completely traces the whole periphery of the IC chip 504. The sealant 503 can be injected into a gap between the IC chip 504 and circuit board 250, or the IC chip 504 can be sealed in the above operation upon completion of the sealing, the nozzle 502 is returned to the standby position as shown by ⑤.

Figure 24:
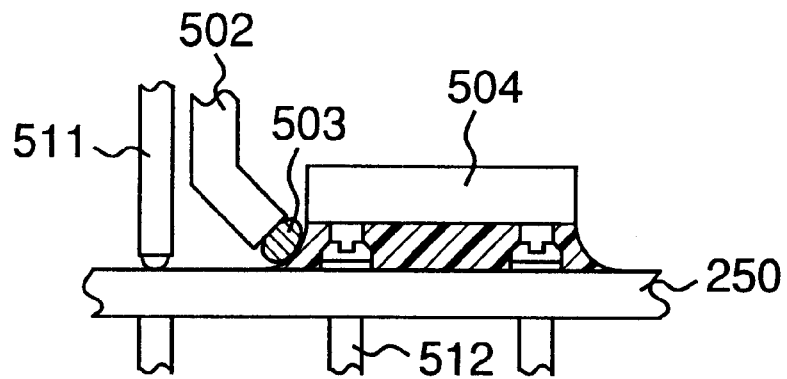
FIG. 24 is a diagram of the application operation of the sealant applying apparatus of FIG. 22.
Figure 25:
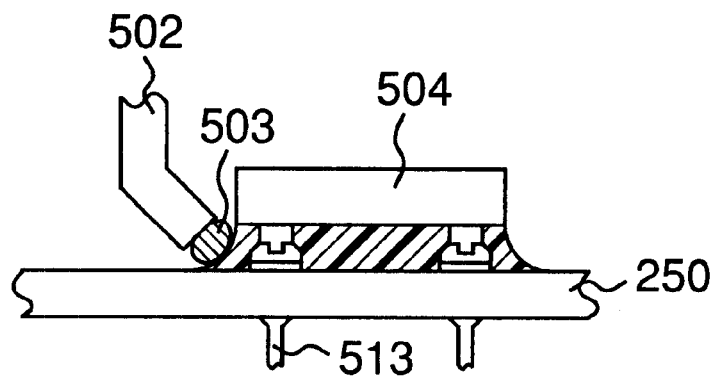
FIG. 25 is a diagram of the application operation of the sealant applying apparatus of FIG. 22.
Figure 26:
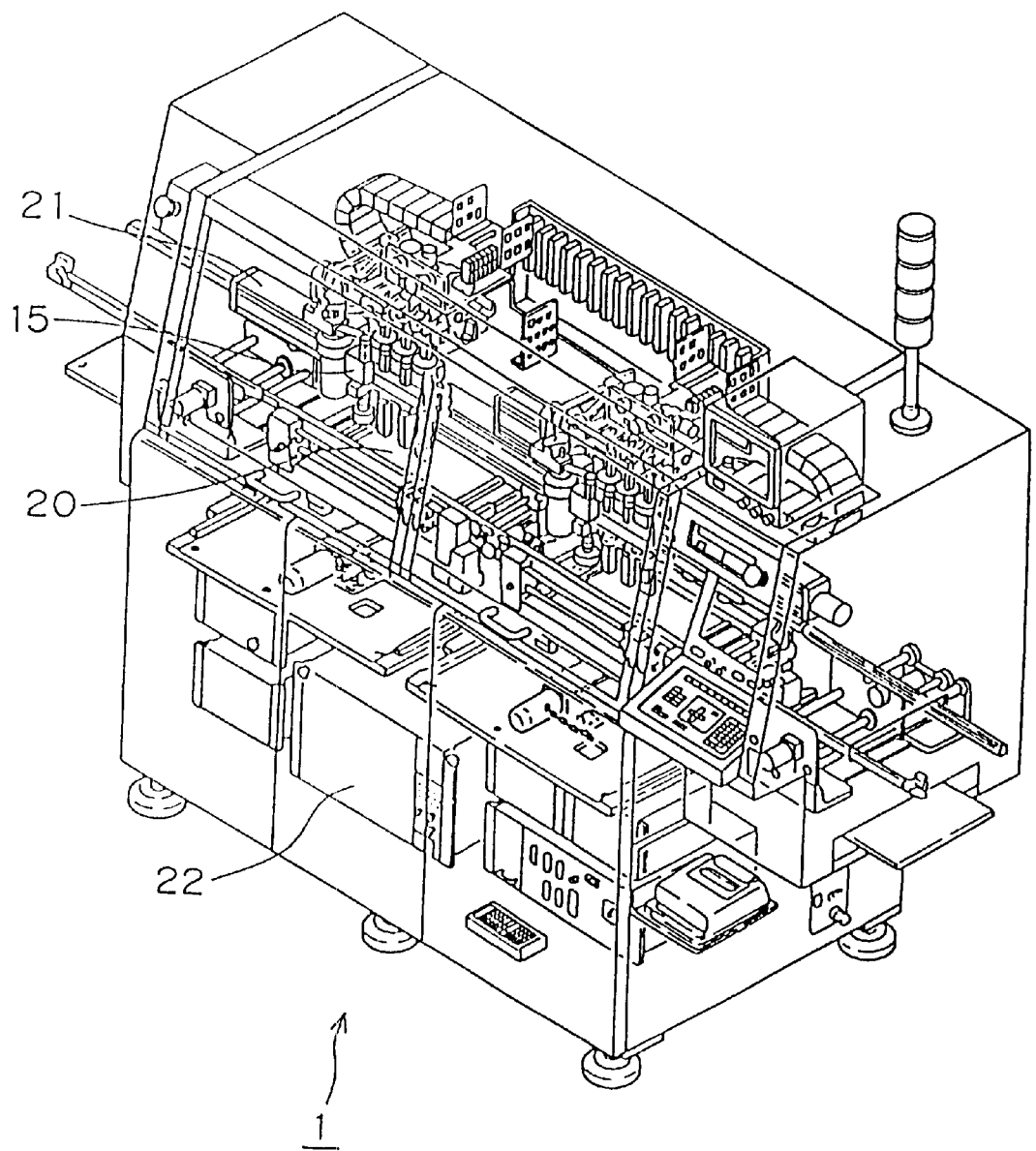
FIG. 26 is a perspective view of a conventional adhesive applying apparatus.
Figure 27:
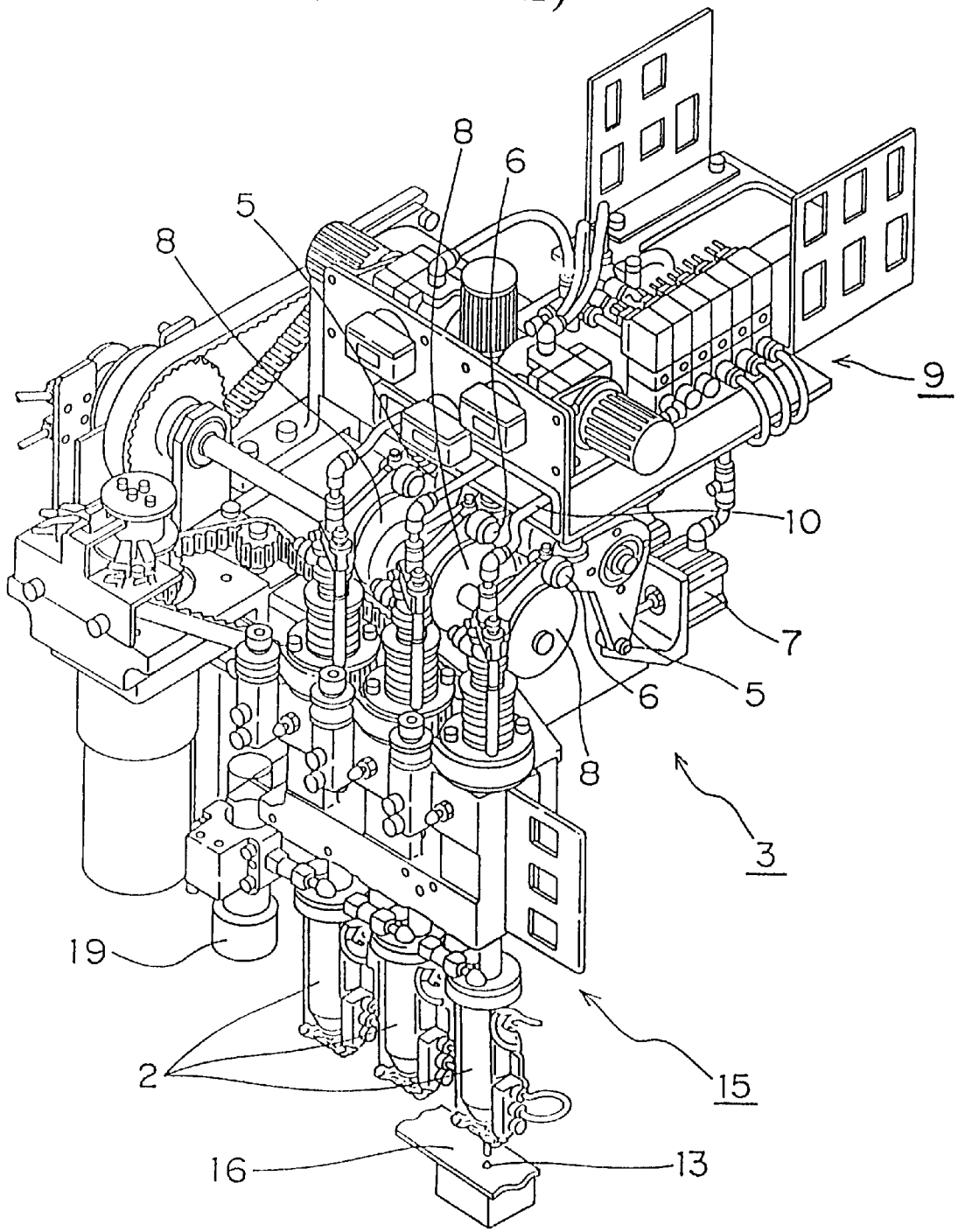
FIG. 27 is a perspective view of an application head unit portion of the adhesive applying apparatus shown in FIG. 26.
Figure 28:
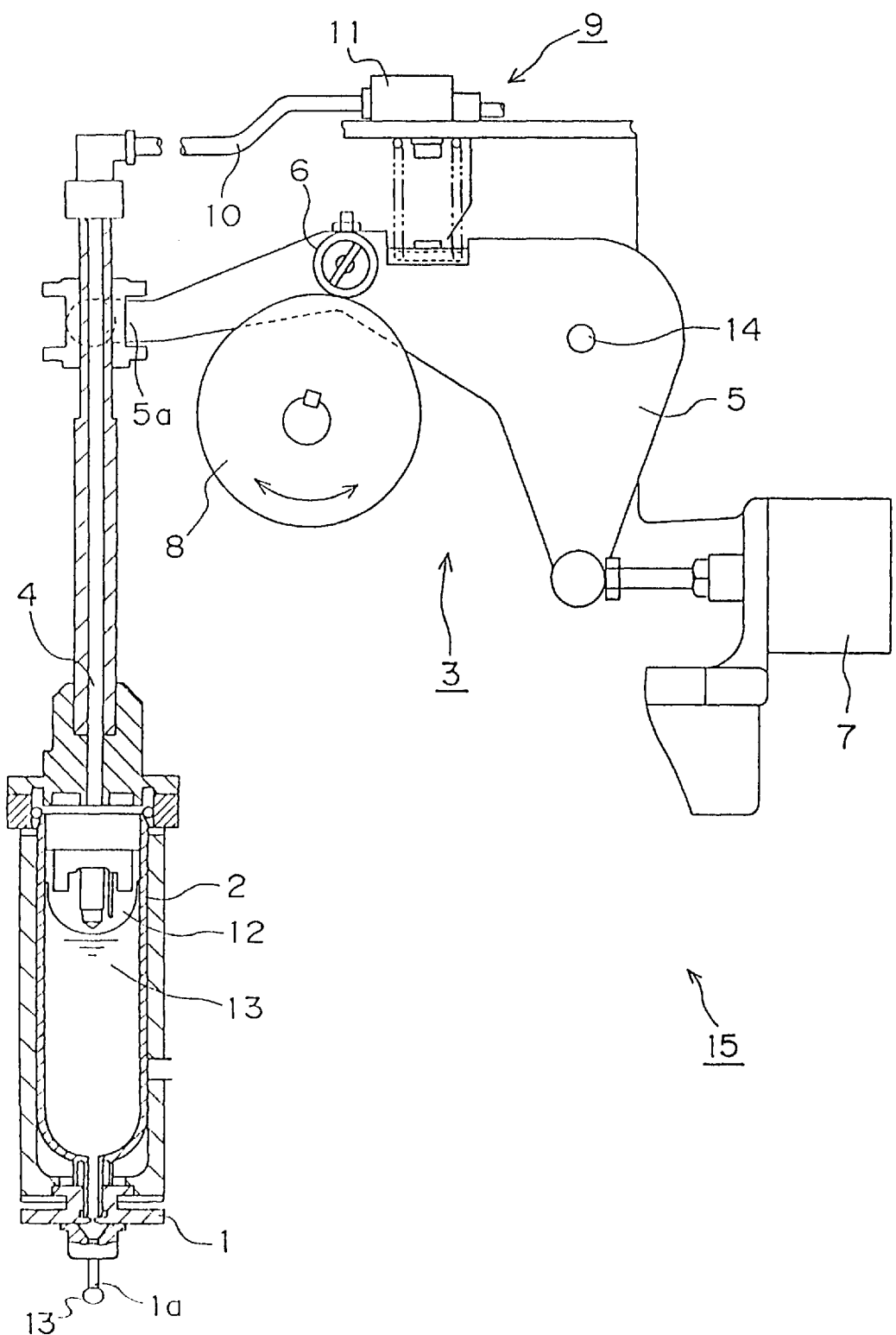
FIG. 28 is a side view of the application head unit portion of FIG. 27.
Figure 29:
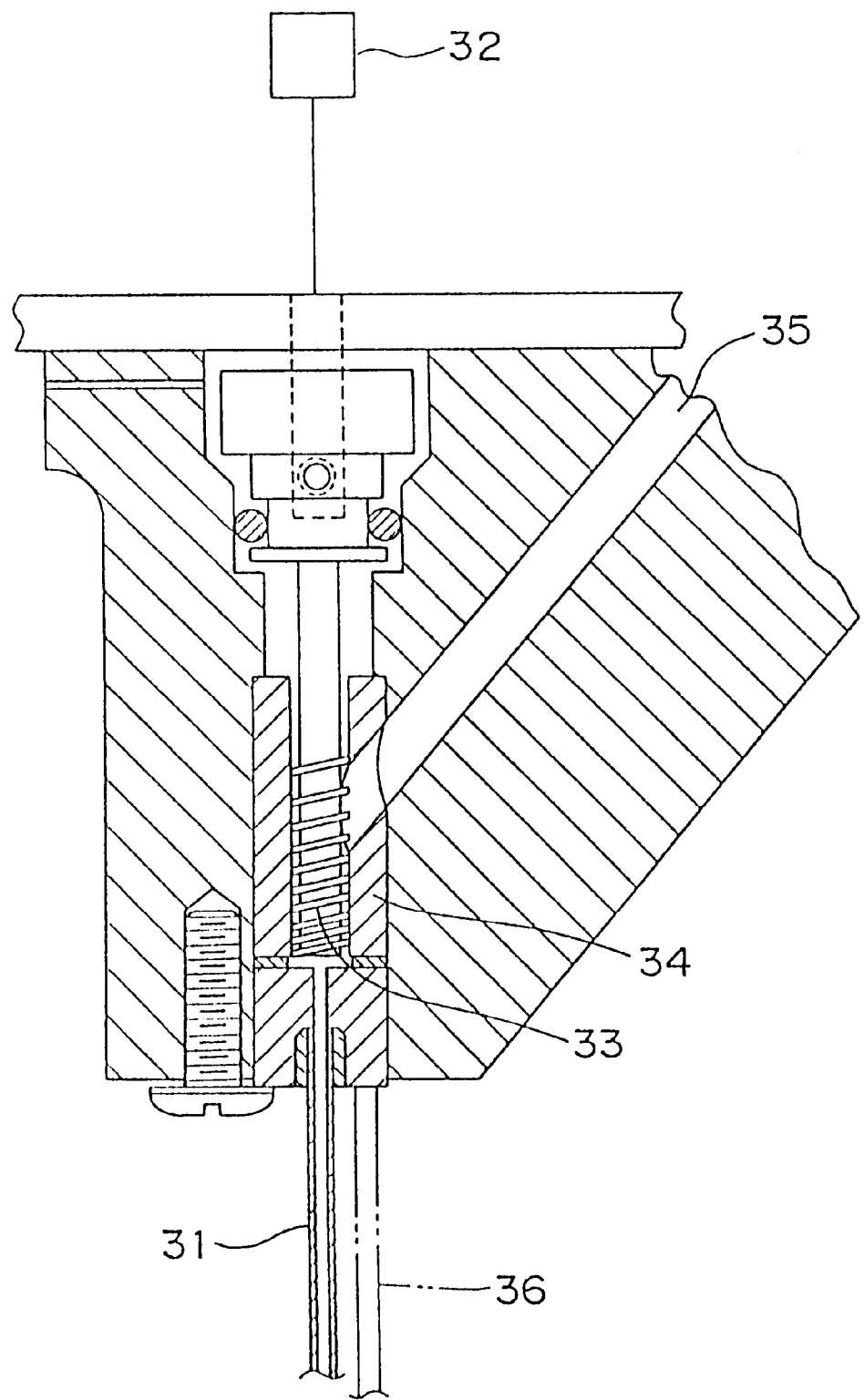
FIG. 29 is a sectional view of a screw portion of a conventional screw type material-applying apparatus.

At the time of the above sealing operation, as shown in FIGS. 24 and 25, the circuit board 250 is held by a support pin 512 and a stopper 511 having a ball at a portion where the stopper comes into contact with the circuit board 250, or by a pin 513 with a suction pad.

As described above, according to the adhesive applying apparatus 101 of the embodiment and the sealant applying apparatus, first, the viscous fluid such as the adhesive 251, sealant 503 or the like is discharged from the nozzle 2101, etc. consequent to the rotation of the discharge shaft 2121 about the axis thereof, and the memory section 313 is provided which stores the relationship information of, e.g., viscosities of the viscous fluids and application sizes so that a required application size is attained in accordance with, e.g., the viscosity of the viscous fluid. By means of the memory section 313, the control device 301 automatically controls the rotation of the discharge shaft 2121. Accordingly, anyone can handle the apparatus with ease, whereby the application operation with the required application size is facilitated such application operation that causes product failures is reduced, and therefore, the loss of the cycle time is eliminated.

In addition, since the nozzle stopper 2114 is prevented from interfering with, e.g., the wiring pattern on the circuit board 250, the circuit board 250 stands a lesser chance of being damaged.

Although the present invention has been fully described in connection with the preferred embodiments thereof with reference to the accompanying drawings, it is to be noted that various changes and modifications are apparent to those skilled in the art such changes and modifications are to be understood as included within the scope of the present invention as defined by the appended claims unless they depart therefrom.

What is claimed is:

1. An apparatus for applying a viscous fluid to an object, comprising:

a viscous fluid application member to receive a viscous fluid;

a nozzle for discharging the viscous fluid from one end of said nozzle and applying the viscous fluid to an object;

a discharge shaft that is insertable within said viscous fluid application member along an axis of said nozzle and rotatable about the axis of said nozzle such that when said discharge shaft is inserted within said viscous fluid application member along the axis of said nozzle and rotated about the axis of said nozzle, said discharge shaft conveys the viscous fluid along the axis of said nozzle whereby the viscous fluid is discharged from and held at said one end of said nozzle; and a viscous fluid application member-rotating device to rotate said viscous fluid application member about an axis of said discharge shaft in response to an application condition of the viscous fluid.

2. The apparatus according to claim 1, further comprising:

a discharge shaft-rotating device to rotate said discharge shaft about the axis of said nozzle.

3. The apparatus according to claim 2, further comprising:

a nozzle-moving device to move said nozzle along the axial direction of said nozzle such that when said nozzle is moved along the axial direction of said nozzle, the viscous fluid held at said one end of said nozzle is applied to the object.

4. The apparatus according to claim 3, wherein said viscous fluid application member includes said nozzle such that said nozzle-moving device is to move said viscous fluid application member along the axial direction of said nozzle to apply the viscous fluid held at said one end of said nozzle to the object.

5. The apparatus according to claim 4, further comprising:

a discharge prevention device to prevent the viscous fluid from being discharged from said one end of said nozzle while said viscous fluid application member is being rotated by said viscous fluid application member-rotating device.

6. The apparatus according to claim 5, wherein said discharge prevention device comprises a control device to control said discharge shaft-rotating device such that said discharge shaft is rotated by said discharge shaft-rotating device about an axis of said nozzle in a direction and by an amount whereby the viscous fluid is prevented from being discharged from said one end of said nozzle while said viscous fluid application member is being rotated by said viscous fluid application member-rotating device.

7. The apparatus according to claim 6, wherein said control device is to control said discharge shaft-rotating device such that said discharge shaft is rotated by said discharge shaft-rotating device about the axis of said nozzle in the direction and by the amount whereby said discharge shaft does not rotate relative to said viscous fluid application member.

8. The apparatus according to claim 7, wherein said control device is to control said discharge shaft-rotating device such that said discharge shaft does not rotate relative to said viscous fluid application member in response to a relationship between an application size of the viscous fluid to be applied to the object and a number of revolutions of said discharge shaft about the axis of said nozzle.

9. The apparatus according to claim 7, further comprising:

an application size-detecting device for detecting an application size of the viscous fluid to be applied to the object and sending to said control device information pertaining to the application size, wherein said control device is also to control said discharge shaft-rotating device such that rotation of said discharge shaft about the axis of said nozzle is controlled in response to the detected application size.

10. The apparatus according to claim 6, wherein said control device is to control said discharge shaft-rotating device such that said discharge shaft is rotated by said discharge shaft-rotating device about the axis of said nozzle in the direction and by the amount in response to physical properties of the viscous fluid.

11. The apparatus according to claim 10, further comprising:

a measuring device to measure the physical properties of the viscous fluid and send to said control device measurement information pertaining to the measured physical properties, and wherein said control device is to control said discharge shaft-rotating device such that said discharge shaft is rotated by said discharge shaft-rotating device about the axis of said nozzle in the direction and by the amount in response to physical properties of the viscous fluid by controlling said discharge shaft-rotating device such that said discharge shaft is rotated by said discharge shaft-rotating device about the axis of said nozzle in the direction and by the amount in response to the measurement information.

12. The apparatus according to claim 11, wherein said control device is also to control said discharge shaft-rotating device for controlling rotation of said discharge shaft about the axis of said nozzle in response to a relationship between an application size of the viscous fluid to be applied to the object and a number of revolutions of said discharge shaft about the axis of said nozzle.

13. The apparatus according to claim 12, further comprising:

an application size-detecting device to detect the application size of the viscous fluid to be applied to the object and send to said control device information pertaining to the application size, wherein said control device is to control said discharge shaft-rotating device for controlling rotation of said discharge shaft about the axis of said nozzle in response to a relationship between an application size of the viscous fluid to be applied to the object and a number of revolutions of said discharge shaft about the axis of said nozzle by controlling said discharge shaft-rotating device in response to a relationship between the information pertaining to the application size and the number of revolutions of said discharge shaft about the axis of said nozzle.

14. The apparatus according to claim 13, wherein said discharge shaft is exchangeable with another discharge shaft, and said control device is also to control said discharge shaft-rotating device such that rotation of said another discharge shaft is controlled when said another discharge shaft is exchanged with said discharge shaft.

15. The apparatus according to claim 11, further comprising:

an application size-detecting device for detecting an application size of the viscous fluid to be applied to the object and sending to said control device information pertaining to the application size, wherein said control device is also to control said discharge shaft-rotating device such that rotation of said discharge shaft about the axis of said nozzle is controlled in response to the detected application size.

16. The apparatus according to claim 6, wherein said control device is to control said discharge shaft-rotating device such that said discharge shaft is rotated by said discharge shaft-rotating device about the axis of said nozzle in the direction and by the amount in response to a relationship between an application size of the viscous fluid to be applied to the object and a number of revolutions of said discharge shaft about the axis of said nozzle.

17. The apparatus according to claim 6, further comprising:

an application size-detecting device for detecting an application size of the viscous fluid to be applied to the object and sending to said control device information pertaining to the application size, wherein said control device is also to control said discharge shaft-rotating device such that rotation of said discharge shaft about the axis of said nozzle is controlled in response to the detected application size.

18. The apparatus according to claim 6, wherein said discharge shaft is exchangeable with another discharge shaft, and said control device is also to control said discharge shaft-rotating device such that rotation of said another discharge shaft is controlled when said another discharge shaft is exchanged for said discharge shaft.

19. The apparatus according to claim 5, wherein said discharge prevention device comprises a connection-shutting device to disconnect said discharge shaft-rotating device from said discharge shaft while said viscous fluid application member is being rotated by said viscous fluid application member-rotating device.

20. A method for applying a viscous fluid to an object, comprising:

rotating a discharge shaft that is inserted within a rotating viscous fluid application member along an axial direction of a nozzle, in a direction about an axis of said discharge shaft such that viscous fluid in said viscous fluid application member is prevented from being discharged from an end of said nozzle;

rotating said discharge shaft relative to said viscous fluid application member, while said discharge shaft is inserted within said viscous fluid application member along the axial direction of said nozzle, in a direction about the axis of said discharge shaft in response to an application condition of said viscous fluid such that said viscous fluid is discharged from and held at said end of said nozzle; and bringing said viscous fluid discharged from and held at said end of said nozzle into contact with an object.

21. The method according to claim 20, wherein rotating said discharge shaft, while inserted within said rotating viscous fluid application member along an axial direction of said nozzle, in the direction about the axis of said discharge shaft such that said viscous fluid in said viscous fluid application member is prevented from being discharged from said end of said nozzle comprises rotating said discharge shaft in the direction and by an amount in response to physical properties of said viscous fluid.

22. The method according to claim 21, wherein rotating said discharge shaft in the direction and by an amount such that said viscous fluid in said rotating viscous fluid application member is prevented from being discharged from said end of said nozzle comprises rotating said discharge shaft in the direction and by the amount such that said discharge shaft does not rotate relative to said rotating viscous fluid application member.

* * * * *